(12) United States Patent
Wetzker et al.

(10) Patent No.: US 10,574,435 B2
(45) Date of Patent: Feb. 25, 2020

(54) APPARATUS AND METHOD FOR CROSS-DOMAIN ANALYSIS OF RADIO SYSTEMS

(71) Applicant: Fraunhofer-Gesellschaft zur Foerderung der angewandten Forschung e.V., Munich (DE)

(72) Inventors: Ulf Wetzker, Dresden (DE); Andreas Frotzscher, Dresden (DE); Ingmar Splitt, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/220,855

(22) Filed: Dec. 14, 2018

(65) Prior Publication Data

US 2019/0190693 A1 Jun. 20, 2019

(30) Foreign Application Priority Data

Dec. 15, 2017 (EP) .................................... 17207785

(51) Int. Cl.
*H04L 7/027* (2006.01)
*G01R 13/02* (2006.01)
(Continued)

(52) U.S. Cl.
CPC .......... *H04L 7/027* (2013.01); *G01R 13/0254* (2013.01); *G01R 23/18* (2013.01);
(Continued)

(58) Field of Classification Search
CPC ....... H04L 7/027; H04L 5/0005; H04L 7/007; G01R 13/0254; G01R 23/18; H04W 74/0858
See application file for complete search history.

(56) References Cited

U.S. PATENT DOCUMENTS 7,184,777 B2 2/2007 Diener et al.
7,848,398 B2 * 12/2010 Fernandez ............. H04N 7/108
375/222
(Continued)

FOREIGN PATENT DOCUMENTS

EP 3170333 A1 5/2017

OTHER PUBLICATIONS

Frotzscher, Andreas, "Ist Funk in der Industrie zukunftssicher?", SPS IPC Drives Messe, Nürnberg, Nov. 2016, Nov. 2016, 1-11.
(Continued)

*Primary Examiner* — Freshteh N Aghdam
(74) *Attorney, Agent, or Firm* — Perkins Coie LLP; Michael A. Glenn

(57) ABSTRACT

An apparatus for analyzing one or several radio systems is provided, having: one or several radio-frequency units for generating one or several baseband signals from one or several radio signals, a spectral analysis module for performing spectral analysis, wherein one of the baseband signals is transformed to a time-frequency domain in order to obtain a spectrogram in the time-frequency domain, one or several demodulators for generating several demodulated radio packets of the one or several radio systems from the one or several baseband signals, the demodulators providing additional information for the demodulated radio packets, a spectrogram analyzer for detecting radio packets found in the spectrogram in the time-frequency domain and for establishing one or several characteristics for each radio packet found based on the spectrogram in the time-frequency domain, and a synchronization module configured to determine one or several pairs, wherein each pair has precisely one demodulated radio packet of the demodulated radio packets, having the one or several characteristics of precisely one radio packet found of the radio packets found.

16 Claims, 12 Drawing Sheets

(51) Int. Cl.
*G01R 23/18* (2006.01)
*H04L 5/00* (2006.01)
*H04L 7/00* (2006.01)
*H04W 74/08* (2009.01)

(52) U.S. Cl.
CPC ............ *H04L 5/0005* (2013.01); *H04L 7/007* (2013.01); *H04W 74/0858* (2013.01)

(56) References Cited

U.S. PATENT DOCUMENTS

| | | |
|---|---|---|
| 9,143,968 B1 | 9/2015 | Manku et al. |
| 2003/0198200 A1 | 10/2003 | Diener et al. |
| 2005/0073983 A1 | 4/2005 | Diener |
| 2005/0227625 A1 | 10/2005 | Diener |
| 2007/0098045 A1* | 5/2007 | Cameron ............ G01R 13/029 375/130 |
| 2007/0264939 A1 | 11/2007 | Sugar |
| 2008/0059098 A1* | 3/2008 | Zhang ................ G01S 7/52077 702/103 |
| 2009/0052500 A1 | 2/2009 | Bush et al. |
| 2010/0310012 A1* | 12/2010 | Hsu ........................ H04L 7/027 375/324 |
| 2014/0207414 A1* | 7/2014 | Bordow ................ G01R 23/18 702/180 |

OTHER PUBLICATIONS

"AirMagnet Spectrum XT Datasheet", https://enterprise-de.netscout.com/enterprise-network/wireless-network/airmagnet-spectrum-xt.

"RSA7100A Spectrum Analyzer Datasheet", https://enterprise-de.netscout.com/enterprise-network/wireless-network/AirMagnet-WiFi-Analyzer.

"RSA7100A Spectrum Analyzer Datasheet", https://www.tek.com/datasheet/rsa7100a.

Wetzker, Ulf et al., "Troubleshooting Wireless Coexistence Problems in the Industrial Internet of Things", IEEE Intl. Conference on Embedded and Ubiquitous Computing (EUC), Aug. 2016, Aug. 2016, 1-12.

\* cited by examiner

APPARATUS AND METHOD FOR CROSS-DOMAIN ANALYSIS OF RADIO SYSTEMS

CROSS-REFERENCE TO RELATED APPLICATION

This application claims priority from European Patent Application No. 17207785.1, which was filed on Dec. 15, 2017, and is incorporated herein by reference in its entirety.

BACKGROUND OF THE INVENTION

The application relates to radio system technologies and, in particular, to an apparatus and a method for cross-domain analysis of radio systems. Particularly, the application relates to state analysis and fault analysis in industrial radio systems, commercial radio systems and also private radio systems.

Nowadays, radio communication systems are employed in many fields, like in industrial automation for data connection of mobile or movable subsystems to higher systems, in different fields of companies, and in large public areas, like stations, airports, trade fair halls and hospitals. Many of the radio systems employed use license-free frequency bands, like ISM (Industrial, Scientific and Medical) frequency bands or UNII (Unlicensed National Information Infrastructure) frequency bands.

However, problems arise when using license-free frequency bands. On the one hand, the frequency bands are employed by a plurality of radio protocols (like Bluetooth, WiFi, etc.) and also differing technical facilities (like by a microwave). Since the access of spatially neighboring radio networks to the radio medium is not coordinated centrally, mutual interference or faults between the radio networks, referred to as coexistence problems, may arise. Temporal, spatial and spectral superpositioning of different radio signals and, partly, the delay of emitting a radio signal due to the radio channel being occupied by another radio signal are among these problems.

In addition, one problem is that the application using radio networking does not receive, or only to a very limited extent, information on the state of the radio transmission system. The radio components employed do not, or not sufficiently, comprise ways of monitoring the state of radio networking since the hardware resources available thereof are very limited. In the case of transmission faults, the radio components are not able to identify the cause of the transmission faults by themselves.

Among other things, spectral analyzers are used for solving the above problems in known technology: operating the measuring apparatuses and interpreting the measuring results are done manually and need a profound knowledge of radio systems. However, this only allows roughly recognizing which radio protocols are used by the radio-frequency (or high-frequency) band measured and which receive power the radio protocols are measured with. Using this solution approach, however, no further information (like occupancy of the frequency band, duration of the radio signals, addresses of the radio nodes) can be detected. The RSA7100A Spectrum Analyzer by Tektronix is an example of such a spectral analyzer (see [3]: https://www.tek.com/datasheet/rsa7100a:RSA7100A).

A further known approach is using protocol analyzers. Known protocol analyzers are designed for one radio protocol (like WiFi) and analyze the contents of radio packets recorded. Due to the limitation to a specific radio protocol and the evaluation of radio packet contents, the protocol analyzers are not able to identify mutual interferences (coexistence problems) between neighboring radio systems using different radio protocols. Examples of protocol analyzers are, for example, the WiFi analyzers: NetScout—AirMagnet (see [4]: http://enterprise-de.netscout.com/enterprise-network/wireless-network/AirMagnet-WiFi-Analyzer).

In addition, combinations of spectrum analyzers and WiFi protocol analyzers are known from known technology. An example of this is NetScout—AirMagnet Spectrum XT (see [5]: http://enterprise-de.netscout.com/content/datasheet-airmagnet-spectrum-xt). This solution/approach automatically analyzes the radio spectrum and recognizes radio protocols (like WiFi, Bluetooth, etc.) using patterns. The information are made visible in the protocol analysis. A detailed spectral analysis of each radio signal and an evaluation based thereon, for example as to channel occupancy or distribution of the receive power per radio protocol, is not performed.

U.S. Pat. No. 7,184,777 B2 (see [6]) refers to the management of usage of the radio-frequency spectrum by means of identification, classification and localization of emissions in a radio-frequency band. A distributed system of "radio sensor apparatuses" is illustrated, which each include an RF receiver with a spectrogram analysis connected thereto and another RF receiver having a demodulator for a certain radio protocol. A spectrogram analysis provides information for using the radio-frequency band monitored (so-called activity information).

EP 3 170 333 A1 (see [7]) discloses a system of distributed spectrogram analysis nodes. In some examples, the wireless spectrogram analysis system comprises radio spectrum analysis apparatuses which are distributed to different locations across a geographical region. The radio spectrum analysis apparatuses are configured so as to simultaneously monitor the radio spectrum utilization at each individual location.

US 2003 0198200 A1 (see [8]) relates to performing a spectrogram analysis and using the information for managing several radio nodes. Information for using the radio-frequency band monitored are calculated and these so-called activity information are used for controlling and managing radio nodes.

US 2009 0052500 A1 (see [9]) shows an apparatus comprising a spectrum analyzer and a decision circuit. The spectrum analyzer is configured to establish wireless signal signature data from a broad range of frequency bands.

US 2007 0264939 A1 (see [10]) shows a method for identifying apparatuses, wherein pulse metrics data represent characteristics which are associated to impulses of radio-frequency energies received. Based on their pulse metrics data, the pulses are subdivided into groups so that one group comprises pulses having similarities for at least one pulse metrics data unit.

In [1], for the first time, a hardware suggestion for a radio analysis apparatus has been presented which, apart from a module for spectral analysis, comprises separate receive modules for three different radio protocols, WiFi, Bluetooth, IEEE 802.15.4. The suggestion of spectral analysis and protocol analysis as illustrated in [1] is also presented in [2].

SUMMARY

According to an embodiment, an apparatus for analyzing one or several radio systems may have: one or several radio-frequency units for generating one or several baseband signals from one or several radio signals, a spectral analysis module for performing spectral analysis, wherein one of the one or several baseband signals is transformed to a time-frequency domain in order to obtain a spectrogram in the time-frequency domain, one or several demodulators for generating two or more demodulated radio packets of the one or several radio systems from the one or several baseband signals, said one or several demodulators being configured to provide additional information for each of the two or several demodulated radio packets, a spectrogram analyzer for detecting two or several radio packets found in the spectrogram in the time-frequency domain and for establishing one or several characteristics for each of the two or several radio packets found based on the spectrogram in the time-frequency domain, and a synchronization module configured to determine one or several pairs, wherein each of the one or several pairs has precisely one demodulated radio packet of the two or more demodulated radio packets and having the one or several characteristics of precisely one radio packet found of the two or several radio packets found, wherein the synchronization module is configured to determine each of the one or several pairs such that the one or several characteristics of that radio packet found in the spectrogram of the two or several radio packets found is/are associated to the demodulated radio packet of the pair in that pair which corresponds to the demodulated radio packet of the pair, wherein the synchronization module is configured to determine each of the one or several pairs in dependence on the additional information of the two or several demodulated radio packets and in dependence on the characteristics of the two or several radio packets found, and wherein the synchronization module is configured to output the one or several pairs or information depending on the one or several pairs.

According to another embodiment, a method for analyzing one or several radio systems may have the steps of: generating one or several baseband signals from one or several radio signals, performing spectral analysis, wherein one of the one or several baseband signals is transformed to a time-frequency domain in order to obtain a spectrogram in the time-frequency domain, generating two or more demodulated radio packets of the one or several radio systems from the one or several baseband signals and providing additional information for each of the two or more demodulated radio packets, detecting two or several radio packets found in the spectrogram in the time-frequency domain and establishing one or several characteristics for each of the two or several radio packets found based on the spectrogram in the time-frequency domain, and determining one or several pairs, wherein each of the one or several pairs has precisely one demodulated radio packet of the two or more demodulated radio packets and having the one or several characteristics of precisely one radio packet found of the two or several radio packets found, wherein each of the one or several pairs is determined such that the one or several characteristics of that radio packet found in the spectrogram of the two or several radio packets found is/are associated with the demodulated radio packet of the pair in the pair corresponding to the demodulated radio packet of the pair, wherein each of the one or several pairs is determined in dependence on the additional information of the two or several demodulated radio packets and in dependence on the characteristics of the two or several radio packets found, and outputting the one or several pairs or information depending on the one or several pairs.

Still another embodiment may have a non-transitory digital storage medium having stored thereon a computer program for performing a method for analyzing one or several radio systems having the steps of: generating one or several baseband signals from one or several radio signals, performing spectral analysis, wherein one of the one or several baseband signals is transformed to a time-frequency domain in order to obtain a spectrogram in the time-frequency domain, generating two or more demodulated radio packets of the one or several radio systems from the one or several baseband signals and providing additional information for each of the two or more demodulated radio packets, detecting two or several radio packets found in the spectrogram in the time-frequency domain and establishing one or several characteristics for each of the two or several radio packets found based on the spectrogram in the time-frequency domain, and determining one or several pairs, wherein each of the one or several pairs has precisely one demodulated radio packet of the two or more demodulated radio packets and having the one or several characteristics of precisely one radio packet found of the two or several radio packets found, wherein each of the one or several pairs is determined such that the one or several characteristics of that radio packet found in the spectrogram of the two or several radio packets found is/are associated with the demodulated radio packet of the pair in the pair corresponding to the demodulated radio packet of the pair, wherein each of the one or several pairs is determined in dependence on the additional information of the two or several demodulated radio packets and in dependence on the characteristics of the two or several radio packets found, and outputting the one or several pairs or information depending on the one or several pairs, when said computer program is run by a computer.

An apparatus for analyzing one or several radio systems in accordance with an embodiment is provided.

The apparatus comprises one or several radio-frequency (or high-frequency) units for generating one or several baseband signals from one or several radio signals.

In addition, the apparatus comprises a spectral analysis module for performing a spectral analysis, wherein one of the one or several baseband signals is transformed to a time-frequency domain in order to obtain a spectrogram in the time-frequency domain.

Furthermore, the apparatus comprises one or several demodulators for generating two or more demodulated radio packets of the one or several radio systems from the one or several baseband signals, wherein the one or several demodulators is/are additionally configured to provide additional information for each of the two or several demodulated radio packets.

Additionally, the apparatus comprises a spectrogram analyzer for detecting two or several radio packets found in the spectrogram in the time-frequency domain and for establishing one or several characteristics for each of the two or several radio packets found based on the spectrogram in the time-frequency domain.

Additionally, the apparatus comprises a synchronization module configured to determine one or several pairs, wherein each of the one or several pairs comprises precisely one demodulated radio packet of the two or more demodulated radio packets and comprising the one or several characteristics of precisely one radio packet found of the two or several radio packets found. Thus, the synchronization module is configured to determine each of the one or several pairs such that the one or several characteristics of that radio packet found in the spectrogram of the two or several radio packets found is/are associated to that demodulated radio packet of the pair in the pair corresponding to the demodulated radio packet of the pair.

Additionally, the synchronization module is configured to determine each of the one or several pairs in dependence on the additional information of the two or several demodulated radio packets and in dependence on the characteristics of the two or several radio packets found. The synchronization module is configured to output the one or several pairs or information depending on the one or several pairs.

Embodiments of the invention are based on a combination of the results of spectrogram analysis and analysis of the demodulated radio packets. Thus, in some embodiments, data from different receive modules are processed.

Embodiments of the invention contribute, for example, to monitoring the transmission quality and/or stability and/or reliability and to detecting and/or diagnosing faults.

Furthermore, embodiments of the invention realize an early recognition of faults occurring in the radio connections and identification of the causes thereof. In some embodiments, propagation problems, interferences between competing radio connections or due to faulty emissions, and hardware and software defects in the radio components can be recognized as potential causes.

Embodiments provide for a combination of the information from individual demodulated radio packets with information from the spectrogram analysis.

In embodiments, the demodulated radio packets are combined with information from the respective spectral images thereof, superpositioning in radio signals is recognized and information derived therefrom are associated with the demodulated radio packets. This means that, in embodiments, a combination of information from the spectrogram analysis and the demodulated radio packets on a packet level is provided.

In embodiments, information for using the radio-frequency band monitor are used, wherein said information which may be referred to as activity information are used for controlling and managing radio nodes.

Additionally, concepts of analyzing the radio-frequency spectrum are presented, which recognize temporal, spatial and spectral superpositioning of radio signals. The information are subsequently associated with the information of the respective concerned demodulated radio packets.

In some embodiments of the invention, spectral data contain information from higher protocol layers. Some embodiments comprise spectrogram analysis and protocol analysis. Some embodiments provide for separate hardware components for detecting the radio-frequency band and detecting and, if applicable, demodulating the radio packets. In embodiments, a distributed system of radio analysis nodes is not a prerequisite.

Methods for analyzing one or several radio systems. The method comprises the steps of:

Generating one or several baseband signals from one or several radio signals.

Performing spectral analysis, wherein one of the one or several baseband signals is transformed to a time-frequency domain in order to obtain a spectrogram in the time-frequency domain.

Generating two or more demodulated radio packets of the one or several radio systems from the one or several baseband signals and providing additional information for each of the two or more demodulated radio packets.

Detecting two or several radio packets found in the spectrogram in the time-frequency domain and establishing one or several characteristics for each of the two or several radio packets found based on the spectrogram in the time-frequency domain. And:

Determining one or several pairs, wherein each of the one or several pairs comprises precisely one demodulated radio packet of the two or more demodulated radio packets and comprising the one or several characteristics of precisely one radio packet found of the two or several radio packets found, wherein each of the one or several pairs is determined such that the one or several characteristics of that radio packet found in the spectrogram of the two or several radio packets found is/are associated with the demodulated radio packet of the pair in the pair corresponding to the demodulated radio packet of the pair, wherein each of the one or several pairs is determined in dependence on the additional information of the two or several demodulated radio packets and in dependence on the characteristics of the two or several radio packets found; and outputting the one or several pairs or information depending on the one or several pairs.

In addition, a computer program code comprising program code for performing the above method is provided.

BRIEF DESCRIPTION OF THE DRAWINGS

Embodiments of the invention will be detailed subsequently referring to the appended drawings, in which.

DETAILED DESCRIPTION OF THE INVENTION

Figure 1:
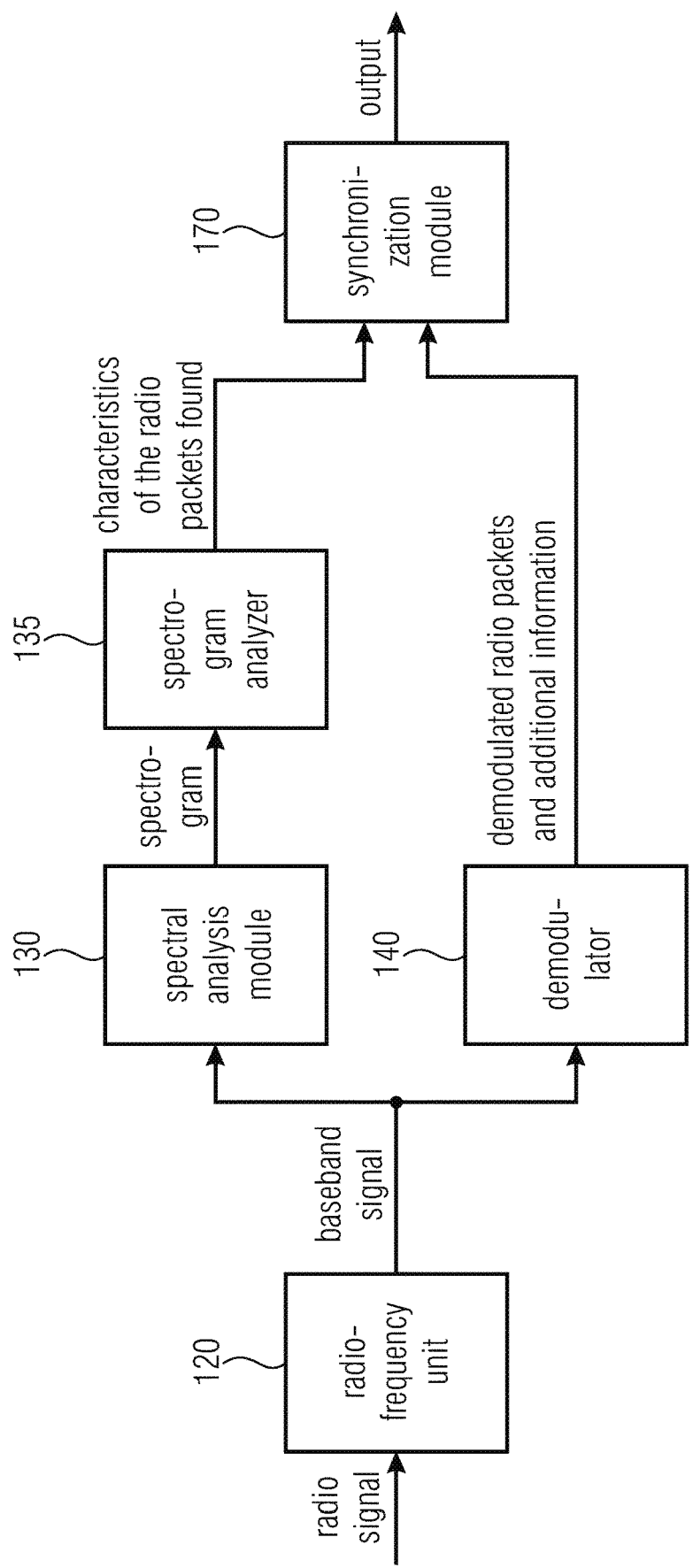
FIG. 1 shows an apparatus for analyzing one or several radio systems in accordance with an embodiment.

FIG. 1 shows an apparatus for analyzing one or several radio systems in accordance with an embodiment.

The apparatus comprises one or several radio-frequency units 120 for generating one or several baseband signals from one or several radio signals.

Additionally, the apparatus comprises a spectral analysis module 130 for performing spectral analysis, wherein one of the one or several baseband signals is transformed to a time-frequency domain in order to obtain a spectrogram in the time-frequency domain.

Furthermore, the apparatus comprises one or several demodulators 140 for generating two or more demodulated radio packets of the one or several radio systems from the one or several baseband signals, wherein the one or several demodulators 140 is/are additionally configured to provide additional information for each of the two or several demodulated radio packets.

In addition, the apparatus comprises a spectrogram analyzer 135 for detecting two or several radio packets found in the spectrogram in the time-frequency domain and for establishing one or several characteristics for each of the two or several radio packets found based on the spectrogram in the time-frequency domain.

Additionally, the apparatus comprises a synchronization module 170 configured to determine one or several pairs, wherein each of the one or several pairs comprises precisely one demodulated radio packet of the two or more demodulated radio packets and comprising the one or several characteristics of precisely one radio packet found of the two or several radio packets found.

Thus, the synchronization module 170 is configured to determine each of the two or several pairs such that the one or several characteristics of that radio packet found in the spectrogram of the two or several radio packets found is/are associated with the demodulated radio packet of the pair in the pair corresponding to the demodulated radio packet of the pair.

In addition, the synchronization module 170 is configured to determine each of the two or several pairs in dependence on the additional information of the two or several demodulated radio packets and in dependence on the characteristics of the two or several radio packets found. The synchronization module 170 is configured to output the two or several pairs or information depending on the two or several pairs.

Some embodiments of the invention are based on detecting all the radio signals in a radio-frequency band considered, transferring the radio signals to the spectral range with subsequent spectral analysis of the radio signals, and demodulating the radio signals for obtaining the digital contents thereof.

A collision may, for example, be defined by a temporal, spectral and spatial superpositioning of two radio packets. (Temporal superpositioning: superpositioning in time; spectral superpositioning: superpositioning in frequency; spatial superpositioning: the radio signals also superimpose one another spatially, that it impede one another and are not distanced in space sufficiently so that there is no impairment.)

In some of the embodiments, a collision (spatial, temporal and spectral superpositioning) between two radio packets (like packet a of radio protocol 1 and, for example, packet b of radio protocol 2 is detected in the spectrogram, wherein there is a suitable demodulator available in the apparatus for only one of the radio packets (like packet a), for example. In such embodiments, the evaluation of packet a may exemplarily comprise the additional information that packet a has collided with a radio packet and that the other radio packet has been emitted by a radio node of radio protocol 2. Thus, the synchronization module 170 may, for example, be configured to output information on a radio protocol of another radio packet which a radio packet found, which corresponds to the demodulated radio packet of this pair, has collided with.

For improved differentiation, subsequently, a radio signal is understood to be the radio-frequency receive signal at the output of the RF unit the radio receiver having been emitted by a radio node. A radio packet is understood to be the result provided by a successful demodulation of the radio signal received in correspondence with the radio protocol used. In addition, technical apparatuses may cause faulty emissions in the radio-frequency bands considered.

In embodiments of the invention, a combined analysis of the information detected from both domains (spectral range and radio protocol level) may be used. This means that the fact that each radio packet can be detected and analyzed on several levels can be made use of. In embodiments, said levels mentioned are, for example, the spectral level or, for example, the bit transmission layer (OSI layer 1) or the security layer (OSI layer 2) or, for example, the network layer (OSI layer 3) or, for example, the transport layer (OSI layer 4) or the application layer (OSI layer 7) (OSI=Open Systems Interconnection).

In embodiments of the invention, the radio signals detected may originate from a single radio network of a certain radio protocol or from several radio networks of the same radio protocol or from several radio networks having different radio protocols.

In accordance with embodiments of the invention, the received signal detected of the radio-frequency band to be analyzed is supplied to a single hardware component or several hardware components for spectral analysis and demodulation of the radio packets. Thus, one or also several demodulators may be used per radio protocol. Two ways of implementing this are represented in FIG. 2 and FIG. 3.

Figure 2:
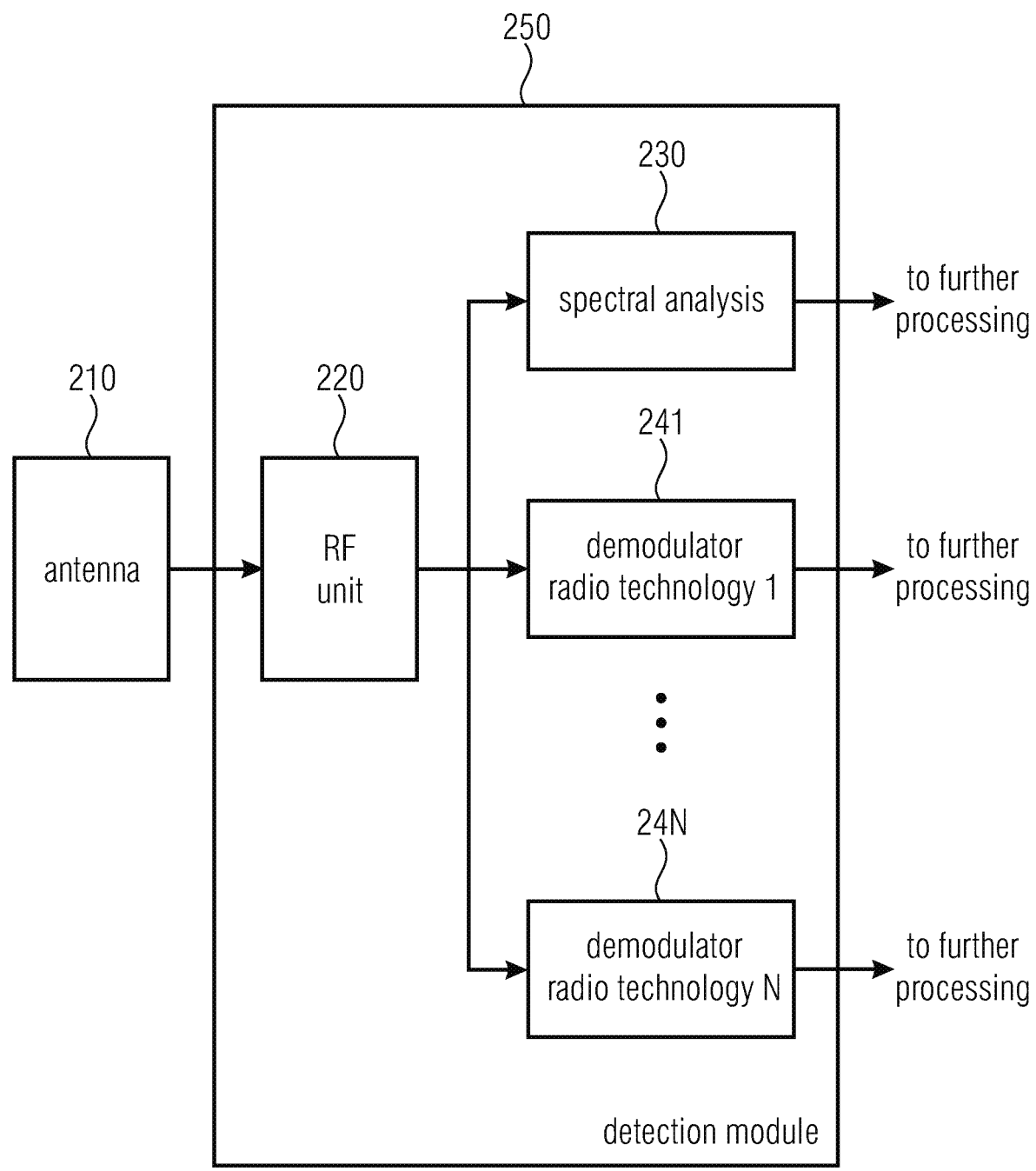
FIG. 2 shows detection of the receive signals in a radio-frequency band by means of a single RF component.

FIG. 2 shows detecting the receive signals in a radio-frequency band by means of a single RF component. A receive signal is received by means of an antenna 210 and processed by an RF unit 220 (radio-frequency unit) which then feeds the processed signal to a spectral analysis module 230 and one or several demodulators 241 to 24N. The radio-frequency unit 220 may, for example, be implemented to generate a baseband signal from the RF signal (radio-frequency signal).

The RF unit 220, the spectral analysis module 230 and the one or several demodulators 241 to 24N may be part of a detection module 250. The spectral analysis module 230 is implemented to perform spectral analysis on the signal received. The demodulators 241 to 24N are implemented to demodulate the signal received.

Figure 3:
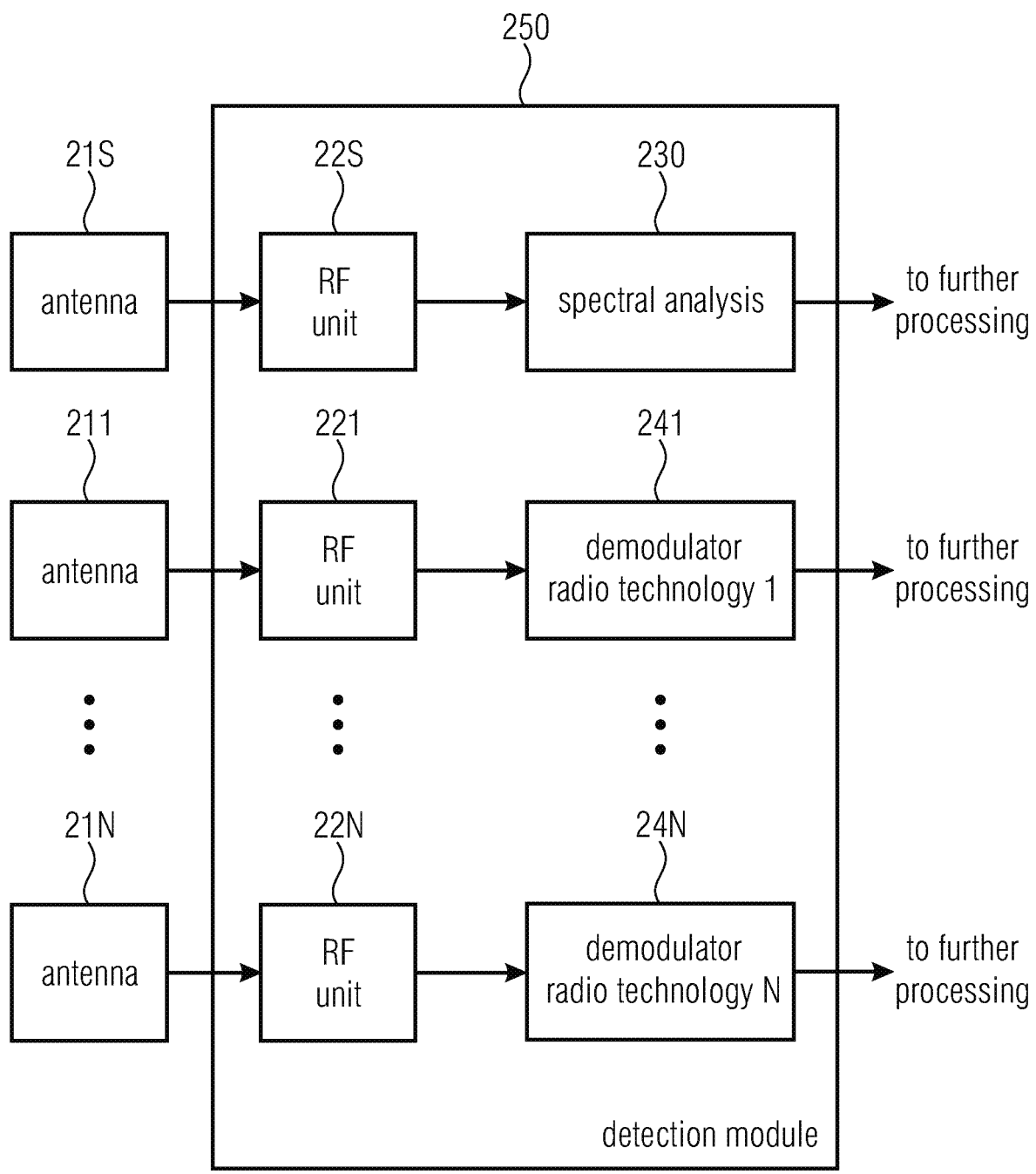
FIG. 3 shows detection of the receive signals in a radio-frequency band by means of several RF components.

Furthermore, FIG. 3 shows detecting the receive signals in a radio-frequency band by means of several RF components. In the example of FIG. 3, the receive signal is received by means of the antennas 21S, 211, . . . , 21N and processed by N+1 radio-frequency units 22S, 221, . . . , 22N which feed the respective processed signal to the spectral analysis module 230 and the N demodulators 241 to 24N.

The detection of the receive signal and the subsequent spectral analysis or demodulation of the radio packets may thus take place using a single hardware module or apparatus or be realized by means of several hardware modules or by means of several apparatuses. The analysis may also be performed on one of the hardware modules used for detection or be integrated on a central computer system.

In some embodiments, the antenna 210 of FIG. 2 or the antennas 21S, 211, 21N of FIG. 3 is/are not part of the apparatus in accordance with FIG. 1. In other, alternative embodiments, the apparatus of FIG. 1 additionally comprises the one or several antennas 210; 21S, 211, 21N for detecting one or several radio signals.

Figure 4:
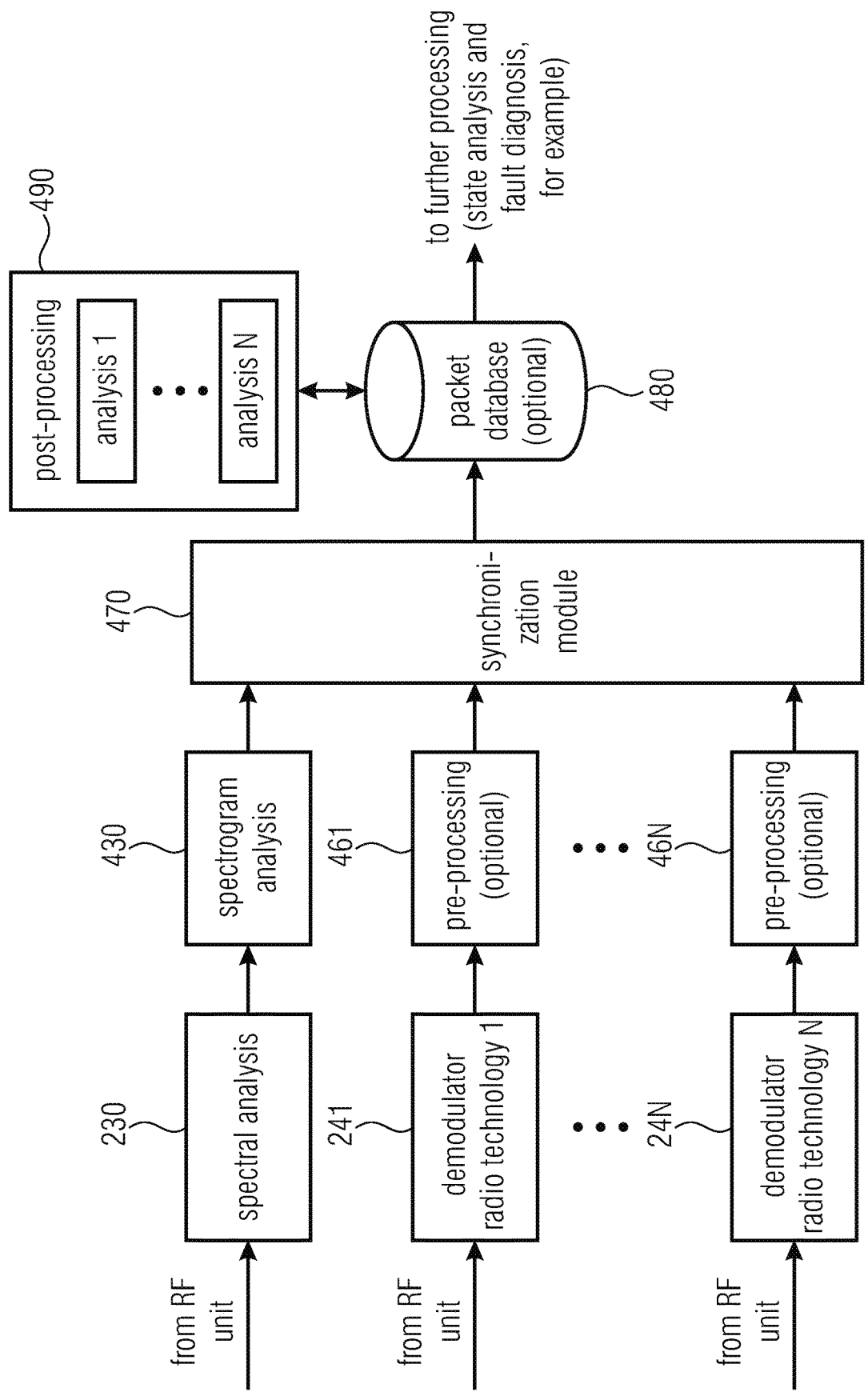
FIG. 4 shows an overview of a concept for cross-domain analysis of radio systems in accordance with an embodiment.

FIG. 4 shows an overview of a concept for cross-domain analysis of radio systems in accordance with an embodiment. In particular, FIG. 4 shows the processing steps in accordance with an embodiment which are performed after the signal detection by the one or several antennas 210 or 21S, 211 . . . 21N and the one or several radio-frequency units 220 or 22S, 221, . . . , 22N.

The modules illustrated in FIG. 4 may, in some embodiments, be realized separately by one or several hardware apparatuses without the one or several radio-frequency units 220 or 21S, 221, . . . , 22N.

In FIG. 4, the spectral analysis module 230 transfers the receive signal to the spectral range portion after portion by means of spectral analysis. The resulting spectrogram is examined further using spectrogram analysis, for example by a spectrogram analyzer 430.

In FIG. 4, spectral analysis and spectrogram analysis are differentiated between. A spectrogram is generated by means of spectral analysis, for example by the spectral analysis module 230. However, spectrogram analysis analyzes the spectrogram generated, for example be performed by the spectrogram analyzer 430.

In spectrogram analysis, the radio signals contained in the radio-frequency spectrum, of radio notes and spurious emissions by other technical systems are detected at first.

Temporal, spatial and spectral superpositioning of several radio signals (so-called packet collision) and of radio signals having fault emissions may also be detected in spectrogram analysis.

Additionally, the radio signal recognized may, for example, be classified in accordance with known radio protocols (radio signals may, for example, be classified as WiFi, Bluetooth, Bluetooth Low Energy, IEEE 802.15.4 or RFID signals).

Additionally, in spectrogram analysis, the radio signals can be examined and different characteristic identifiers be determined (like receive power, bandwidth, skewness of the spectral power distribution, temporal characteristic), the sequence thereof be analyzed and pattern recognition be performed.

The fault emissions recognized can be examined as to their spectral characteristics and clusters of spurious emissions be derived therefrom. The spurious emissions recognized are associated to these clusters.

Spectrogram analysis (like by a spectrogram analyzer 430) in accordance with embodiments will be detailed below.

In FIG. 4, the demodulators 241, . . . , 24N extract from the radio signals received the radio packets of the respective radio protocol supported. Each of the demodulators 241, . . . , 24N may, for example, support a different radio protocol than the other demodulators 241, . . . , 24N.

Each of the demodulators 241, . . . , 24N passes the demodulated packet contents with additional information, for example from the bit transmission layer, on the reception (like receive power of the packets, time of reception, modulation and encoding method of the radio packet) and configuration settings (like receive frequency set) on to a pre-processing module 461, . . . , 46N. Each of the pre-processing modules 461, . . . , 46N is configured to perform different pre-processing steps (like examining or completing the packet data/packet contents). However, the pre-processing block is optional. In other embodiments, it may alternatively be provided for the (radio) packet data/packet information to simply be passed on.

The results of the spectrogram analysis of the spectrogram analyzer 430 and the output of the pre-processing modules 461, . . . , 46N are fed to a synchronization module 470. In embodiments not providing pre-processing modules 461, . . . , 46N, the outputs of the demodulators 241, . . . , 24N (the demodulated packet contents with the additional information) are fed directly to the synchronization module 470.

The synchronization module 470 performs matching and association of the radio signals received of the spectrogram analysis with the entirety or a selection of the demodulated radio packets. Matching may be performed using different methods.

Figure 6:
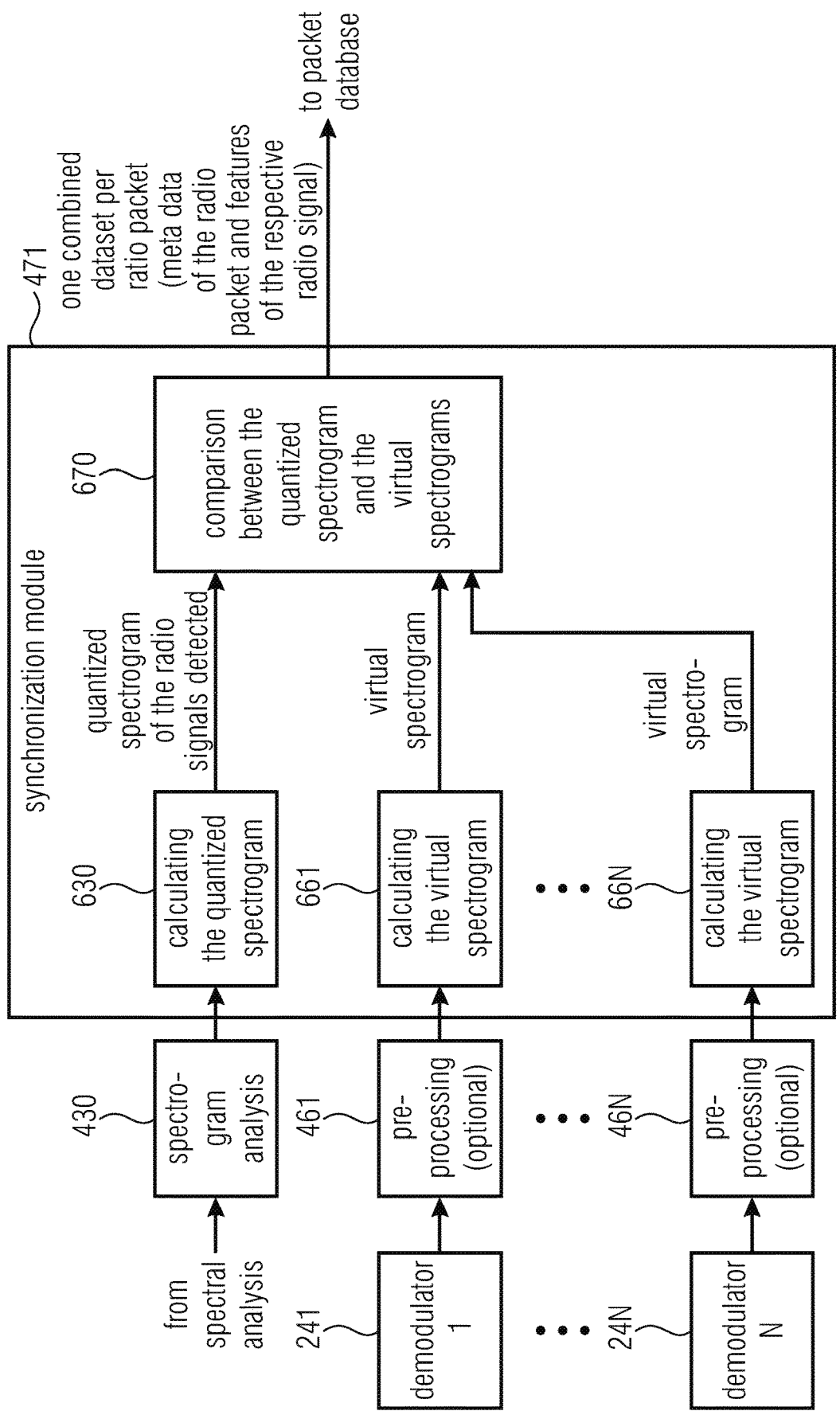
FIG. 6 shows a synchronization module for matching the data of the spectrogram analysis with the demodulated radio packets in accordance with a first group of embodiments.
Figure 7:
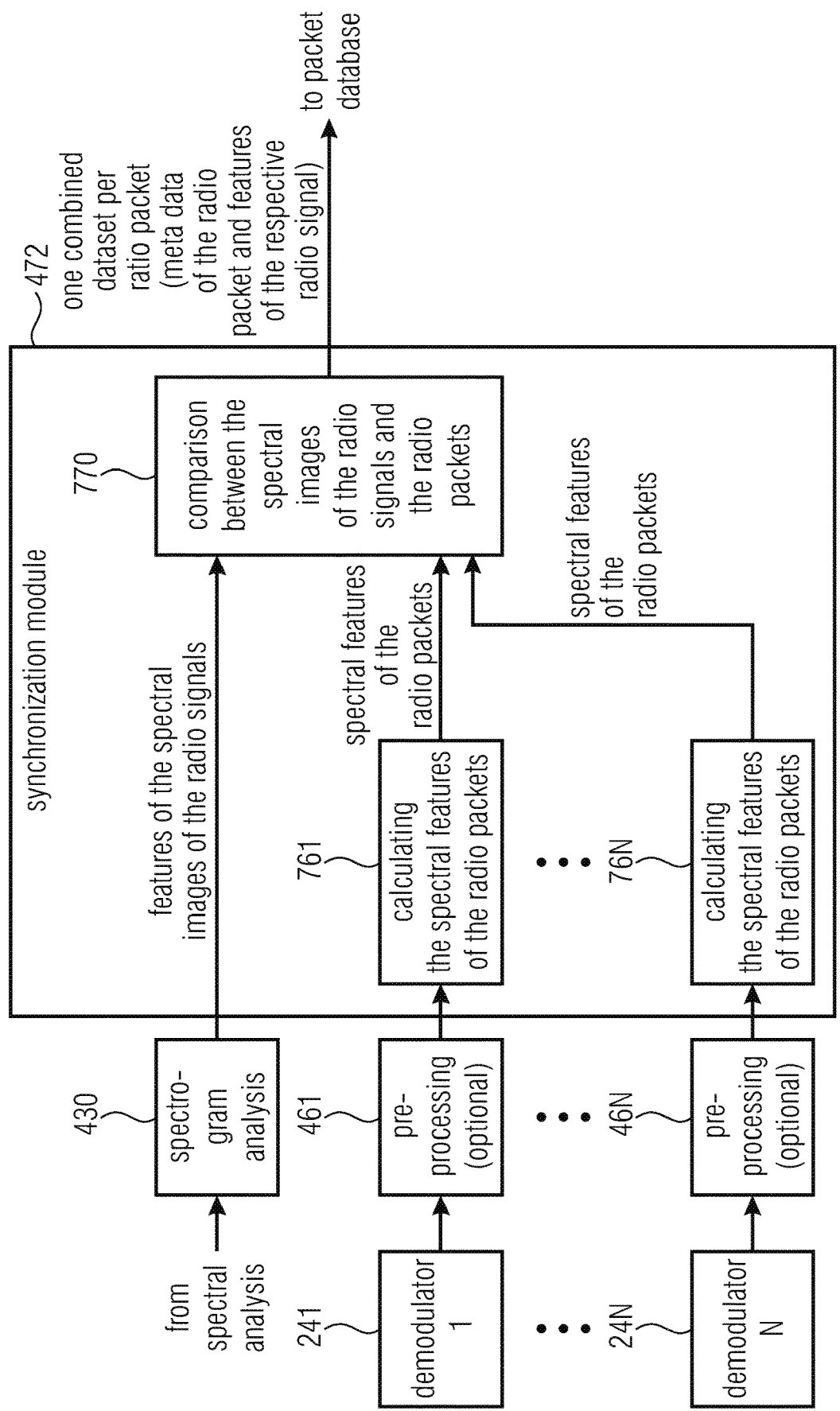
FIG. 7 shows a synchronization module for matching the data of the spectrogram analysis with the demodulated radio packets in accordance with a second group of embodiments.

Making reference to FIG. 6 and FIG. 7, two different embodiments of the synchronization module 470 are described, where matching is performed in the spectral range. Here, at first, virtual spectrograms or features of the spectral images of the radio packets are calculated from the radio packets received.

Figure 8:
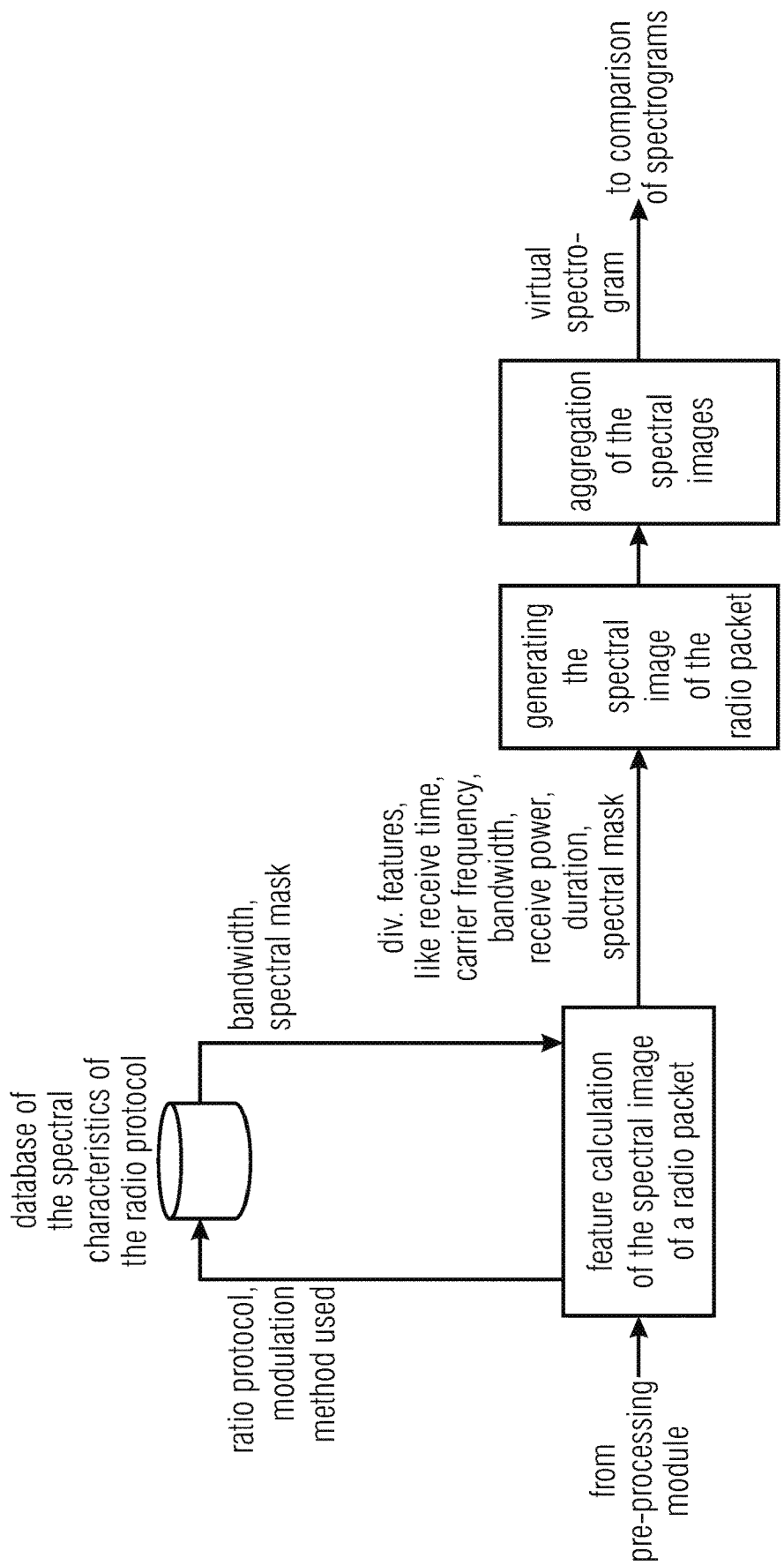
FIG. 8 shows a block circuit diagram for calculating the virtual spectrogram of the demodulated radio packets in accordance with an embodiment.

Making reference to FIG. 8, an embodiment for generating a virtual spectrogram from the data of the radio packets is described. The subsequent matching may take place on the basis of different characteristics (like receive time, length in time, receive power, bandwidth and sequence of radio signals).

As a result of the matching, the synchronization module 470 exemplarily performs an unambiguous association of the demodulated radio packets with the radio signals recognized in the spectrogram analysis. This may, for example, be merging the information from both domains (information from the spectral analysis and information from demodulation) to one data set each per radio packet.

In the case of temporal, spatial and spectral superpositioning recognized of radio signals (so-called packet collisions), the data sets of the respective demodulated radio packets may, for example, be associated to one another.

This means that one data set is generated per radio signal. Each data set contains several parts each. One part serves for storing the features of the spectral image having been calculated in the spectrogram analysis. Another part serves for storing features and contents of the respective radio packet. In case the radio packet could not be demodulated, in embodiments, this part may be dispensed with or remain empty. Another part may be used for storing associations between data sets, like for representing a packet collision. This association, however, may also be stored in different ways.

In embodiments, the synchronization module 470 may transfer the data sets generated to one or different databases 480 (subsequently referred to as packet database) for buffering/storing. Alternatively, buffering is dispensed with and the data sets are passed on directly to the subsequent units.

In embodiments where separate hardware components are used for spectral analysis and demodulation of the radio packets, specific time offsets may occur with the result data of the hardware components (that is the spectrogram and the demodulated radio packets). In this case, the synchronization module 470 may estimate the time offsets. It is desirable here for the receive times of the radio packets, determined by the demodulators, to comprise a tolerable, small jitter caused by the processing chain. However, larger jitter values may occur.

In some embodiments, the synchronization module 470 may, for example, perform association of the radio packets recognized in the spectrogram with demodulated radio packets by means of analysis of sequence, temporal length and bandwidth of the radio packets.

In embodiments, establishing the specific time offsets may be performed based on the comparison between the receive times of the demodulated radio packets and the results of the spectrogram analysis. Static time offsets and temporally varying time offsets between the radio hardware components may be estimated from this. Subsequently, these may be used in order to better define the search windows used when comparing the two domains and thus reduce the calculating complexity of matching.

In embodiments, a post-processing module 490 configured to perform further analyses may be provided. These further analyses may be performed on the basis of the data sets in the packet database, wherein further processing steps are performed, generating additional information. The additional information may, for example, be added to the data sets stored in the database 480, or be stored in a different manner. Exemplarily, information from higher protocol layers can be analyzed from the contents of the radio packets, meta data be extracted and stored.

In addition, for performance reasons, it may be of advantage to perform part of the analyses mentioned before not before storing in the packet database 480, but only afterwards. Thus, the post-processing module 490 may be configured to perform collision detection, classification and pattern recognition of the spectrogram analysis or data analysis of the demodulated radio packets as post-processing steps, for example. In other embodiments, however, it may be provided for part of these post-processing steps to be performed already before feeding the datasets to the packet database 480.

Embodiments are based on the idea of establishing new findings from obtaining information from several sources, in particular from spectrogram analysis and multi-protocol analysis, and from the association of the information.

In particular, it may be provided for the radio connections to be analyzed separately, for example in different levels, like in the spectral level or, for example, in the bit protection layer, or in one or several of OSI layers 2 to 7.

In the bit protection layer, for example, the receive time, the temporal length of the radio packet or the receive power or frequency channel or correctness of receiving or the modulation type may be analyzed.

In one of OSI layers 2 to 7, the packet contents or the transmission radio nodes or the receive radio nodes or the packet type may, for example, be analyzed.

In addition, in embodiments, it may be provided for the radio-frequency spectrum to be analyzed automatically. This may serve for recognizing radio signals in the spectrogram and/or classifying radio signals according to radio protocols, and/or recognizing anomalies in the image of the radio signals in the radio-frequency spectrum, and/or detecting temporal, spatial and spectral superpositioning of several radio signals or radio signals with faulty emissions.

In embodiments, the results of the spectrogram analysis are associated with the demodulated radio packets and packet contents thereof.

In the case of packet collisions, the respective demodulated radio packets are associated with one another.

Subsequently, the spectrogram analysis in accordance with embodiments will be described. The analysis of the spectrogram exemplarily serves for recognizing radio signals in the spectrogram and/or classification according to radio protocols, recognizing patterns in the sequence of the radio signals, and/or recognizing anomalies in the image of the radio signals in the radio-frequency spectrum, and/or detecting temporal and spectral superpositioning of several radio signals or radio signals with faulty emissions.

Figure 5:
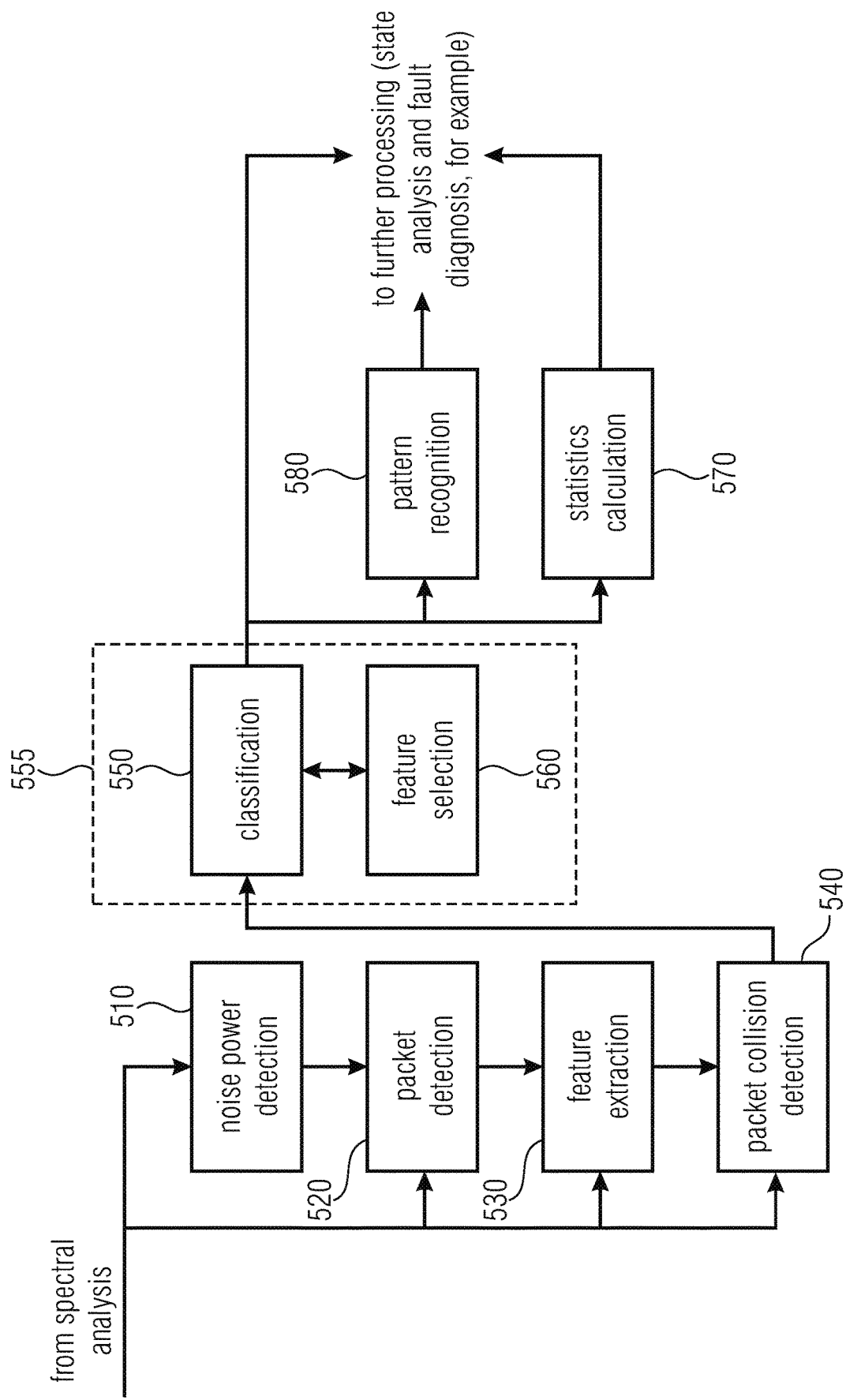
FIG. 5 shows a spectrogram analyzer for automatic spectrogram analysis in accordance with an exemplary embodiment.

FIG. 5 shows a spectrogram analyzer 430 for an automatic spectrogram analysis in accordance with an exemplary embodiment.

The upstream spectral analysis, for example performed by the spectral analysis module 230, calculates/determines the frequency spectrum portion after portion from the receive signal.

In the special embodiment of FIG. 5, the frequency spectrum is exemplarily processed further in a cascade of five analysis blocks (noise power detector 510, packet detector 520, feature extractor 530, packet collision detector 540 and classifier 550).

In embodiments, each analysis block may exemplarily also make use of and/or supplement the results of the respective previous analysis block.

The noise power detector 510 may be configured to estimate the noise power in the spectrogram.

The packet detector 520 may be configured for detecting radio signals in the spectrogram.

The feature extractor 530 may be configured to extract for each radio signal recognized different features from the frequency spectrum, like receive time and/or power parameters and/or power density spectrum and/or frequency characteristics, for example. These features allow drawing conclusions as to whether a collision of radio signals has occurred.

The packet collision detector 540 may be configured to examine, in a suspected case of a packet collision, the respective part of a frequency spectrum.

In FIG. 5, an allocation unit 555 comprises the classifier 550 and a feature selection unit 560.

The classifier 550 may be configured to classify the radio signals recognized as to known radio protocols.

Furthermore, the feature selection unit 560 may, in case the radio signals cannot be associated to any radio protocol known so far, select the significant features of the spectral image of the radio signals, for example.

Additionally, the classifier 550 may exemplarily use concepts of machine learning (of artificial intelligence, for example) in order to learn the spectral appearance of radio protocols not known so far so that radio signals of this radio protocol may also be classified. Exemplarily, neuronal networks may be used here.

The allocation unit 555 is configured for allocating one or several characteristics to each of the two or several radio packets found based on the spectrogram in the time-frequency domain. This functionality may be realized in the classifier 550, in the feature selection unit 560, in both units together or in an allocation sub-module not shown in FIG. 5. The one or several characteristics of the two or several radio packets found may, for example, be a receive time of a radio packet found, a carrier frequency, a bandwidth, a receive power, a duration of the radio packet and/or a power density spectrum of the radio packet.

Figure 9:
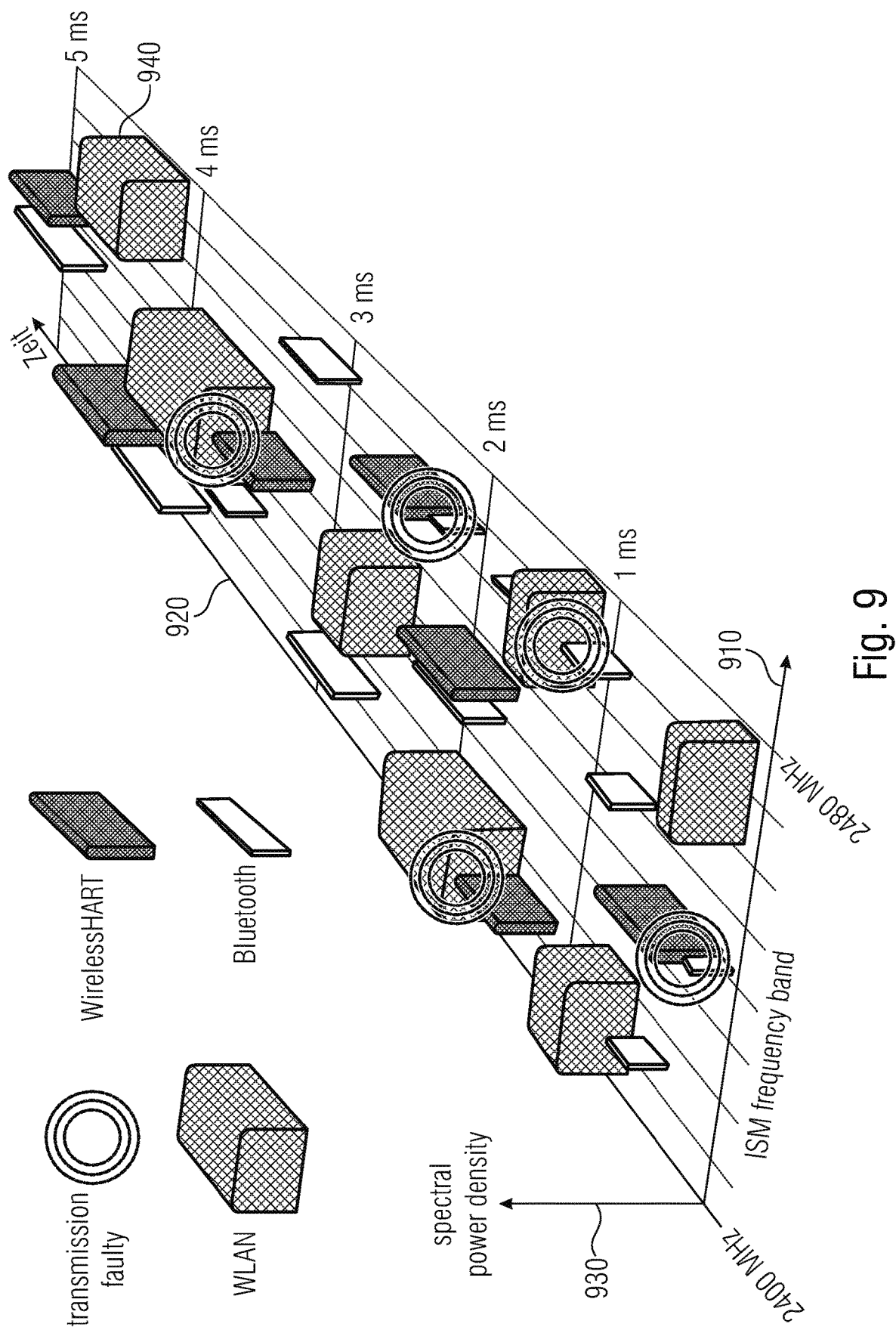
FIG. 9 shows a spectrogram in the time-frequency domain where a plurality of radio packets are illustrated.

FIG. 9 shows a spectrogram in the time-frequency domain where a plurality of radio packets are illustrated. A coordinate axis 910 is the frequency axis. A coordinate axis 920 is the time axis. A coordinate axis 930 is an axis indicating a spectral power density. When there is a radio packet in a region of the time-frequency domain, the value of the spectral power density will be greater than zero, like in the region of the radio packet 940 in the spectrogram in the time-frequency domain.

It has been illustrated before that the noise power detector 510 may be configured to estimate the noise power in the spectrogram.

The noise power detector 510 may be configured to set power values or power density values in the spectrogram which are smaller than or equaling a threshold value which depends on the noise power, in the spectrogram to zero. The packet detector 520 may be configured to determine regions in the time-frequency domain where the power values or the power density values equal zero, to be regions in the time-frequency domain where there is no radio packet. In addition, the packet detector 520 may be configured to determine regions in the time-frequency domain which comprise power values or power density values greater than zero to be regions in the time-frequency domain where there is a radio packet.

Alternatively, the packet detector 520 may be configured to determine the power values or the power density values in the spectrogram which are smaller than or equaling the threshold value, which depends on the noise power, in the spectrogram to be regions in the time-frequency domain where there is no radio packet. Additionally, the packet detector 520 may be configured to determine regions in the time-frequency domain comprising power values or power density values greater than the threshold value to be regions in the time-frequency domain where there is a radio packet.

In FIG. 5, a statistics module 570 may exemplarily perform different statistical calculations for each radio protocol recognized on the basis of the results of the classification performed by the classifier 550, for example. The statistics module may, for example, be configured to calculate a channel occupancy and/or receive power and/or packet length.

Furthermore, a pattern recognition module 580 may be configured to examine the sequence of the radio signals of each radio protocol and perform pattern recognition based on the sequence of the radio signals, for example.

Matching the data of the spectrogram analysis with the demodulated radio packets in accordance with a first group of embodiments will be described below making reference to FIG. 6.

In one embodiment, the packet collision detector 540 is configured to determine for each of the two or several radio packets found, based on the spectrogram in the time-frequency domain, whether this radio packet found has collided with another one of the two or several radio packets found.

The association unit 555 is configured to associate to this radio packet found, as one of the one or several characteristics, the information that there has been a collision with another one of the two or several radio packets found.

In addition, the synchronization module 170; 470; 471; 472 is configured to determine a pair of the one or several pairs such that the precisely one demodulated radio packet of this pair is that radio packet which corresponds to the radio packet found in the spectrogram where there has been a collision with another radio packet, and that one of the one or several characteristics of the pair is the information indicating that there has been a collision in the demodulated radio packet of this pair.

Furthermore, the synchronization module 170; 470; 471; 472 is configured to output the information that there has been a collision in the demodulated radio packet of this pair.

Figure 10A:
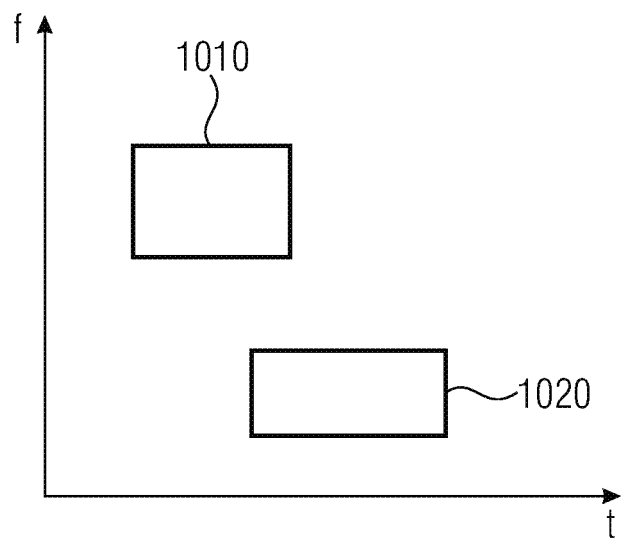
FIG. 10a shows two radio packets in the time-frequency domain which do not collide with each other.
Figure 10B:
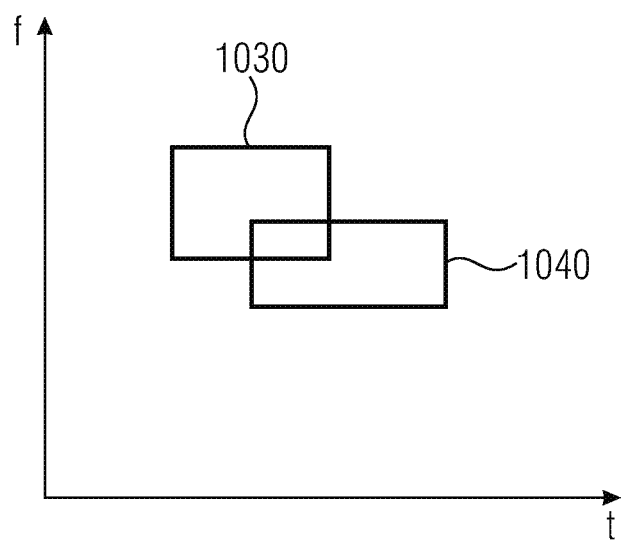
FIG. 10b shows two radio packets in the time-frequency domain which collide with each other.

FIG. 10*a* and FIG. 10*b* describe this. FIGS. 10*a* and 10*b* show a two-dimensional representation of the spectrogram, wherein the t axis indicates time and the f axis indicates the frequency.

In FIG. 10*a*, a first radio packet 1010 and a second radio packet 1020 are free from superpositioning in the time-frequency domain. This means that the two radio packets 1010 and 1020 do not collide.

In FIG. 10*b*, a third radio packet 1030 and a fourth radio packet 1040 are not free from superpositioning in the time-frequency domain. This means that the two radio packets 1030 and 1040 collide.

In one embodiment, it is provided for the packet collision detector 540 to be configured to establish for two radio packets of the two or several radio packets found whether these radio packets collide with each other, by the packet collision detector 540 establishing in the time-frequency domain of the spectrogram whether these two radio packets are free from superpositioning or not.

In another embodiment, the feature extractor 530 is configured to establish for each of the two or several radio packets found, based on the spectrogram in the time-frequency domain, whether this radio packet found exhibits a fault in the spectrogram.

The allocation unit 555 is configured to allocate to this radio packet found, as one of the one or several characteristics, the information indicating that this radio packet found exhibits a fault in the spectrogram.

Additionally, the synchronization module 170; 470; 471; 472 is configured to determine a pair of the one or several pairs such that the precisely one demodulated radio packet of this pair is that radio packet which corresponds to the radio packet found in the spectrogram which comprises a fault in the spectrogram, and that the one of the one or several characteristics of the pair is the information indicating that the demodulated radio packet of this pair has been transmitted with a fault occurring. Faults may, for example, have been caused by hardware defects of the RF unit of the emitting radio node.

Furthermore, the synchronization module 170; 470; 471; 472 is configured to output the information indicating that the demodulated radio packet of this pair has been transmitted with a fault occurring.

Figure 11A:
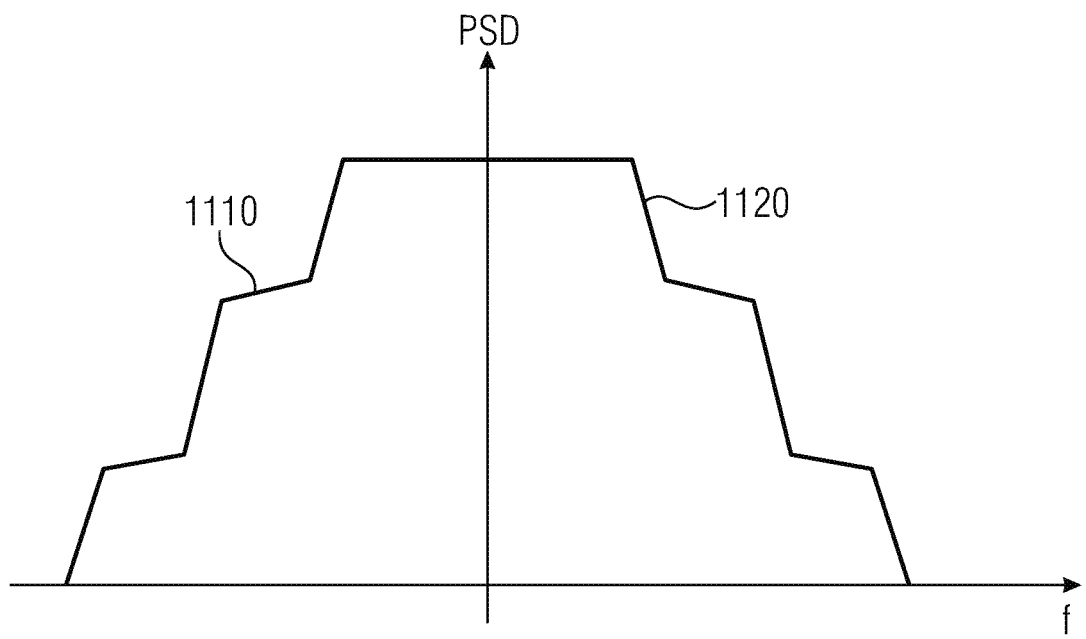
FIG. 11a shows a two-dimensional representation of the spectrogram for a radio packet with the power density spectrum of the radio packet, wherein the power density spectrum of the radio packet is free from faults.
Figure 11B:
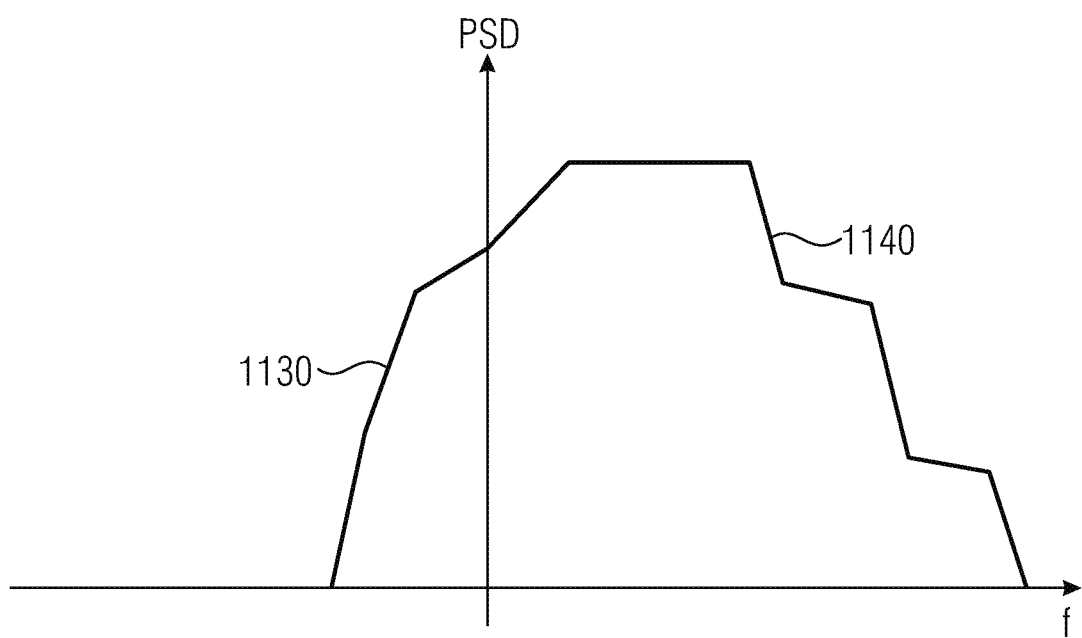
FIG. 11b shows a two-dimensional representation of the spectrogram for a radio packet with the power density spectrum of the radio packet, wherein the power density spectrum of the radio packet is fault-infested.

FIGS. 11*a* and 11*b* discuss this. FIGS. 11*a* and 11*b* show a two-dimensional representation of the spectrogram for a radio packet, wherein the f axis indicates the frequency and wherein the PSD (Power Spectral Density) axis indicates the power density.

FIG. 11*a* specifically shows a power density spectrum of a radio packet. In FIG. 11*a*, the power density spectrum of the radio packet is symmetrical. Specifically, the lower-frequency part 1110 of the power density spectrum and the higher-frequency part 1120 of the power density spectrum are symmetrical.

However, in FIG. 11*b*, the power density spectrum of the radio packet is unsymmetrical. In particular, the lower-frequency part 1130 of the power density spectrum and the higher-frequency part 1140 of the power density spectrum are unsymmetrical. The occurrence of a fault can be concluded from to the lacking symmetry of the power density spectrum of the data packet.

Thus, the feature extractor 530 may, for example, be configured to determine, for a radio packet of the two or several radio packets found, based on the spectrogram in the time-frequency domain whether the radio packet found exhibits a fault in the spectrogram, wherein the feature extractor 530 establishes whether a power density spectrum of the radio packet exhibits an asymmetry in the frequency-power density domain of the spectrogram. (Exemplarily an unsymmetrical deviation from a spectral mask specified in a specification document of a radio protocol.)

Instead of examining the power density spectrum as to symmetries, alternatively a predefined correct spectral mask may be loaded from a database and be examined as to matching with the actual power density spectrum. A spectral mask here is to be understood to be a predefined or stored power density spectrum of an (ideal or idealized) radio packet, for example. A fault can be concluded from lacking matching of the predefined correct spectral mask with the actual power density spectrum of the radio packet in the spectrogram.

The feature extractor 530 may, for example, be configured to determine for a radio packet of the two or several radio packets found, based on the spectrogram in the time-frequency domain whether this radio packet found exhibits a fault in the spectrogram, wherein the feature extractor 530 here compares an actual power density spectrum of the radio packet in a frequency-power density domain to a predefined spectral mask.

Exemplarily, the feature extractor 530 may be configured to load the predefined spectral mask from a database in dependence on a radio protocol of the radio packet found. Thus, spectral masks of different radio protocols are usually different.

Figure 12A:
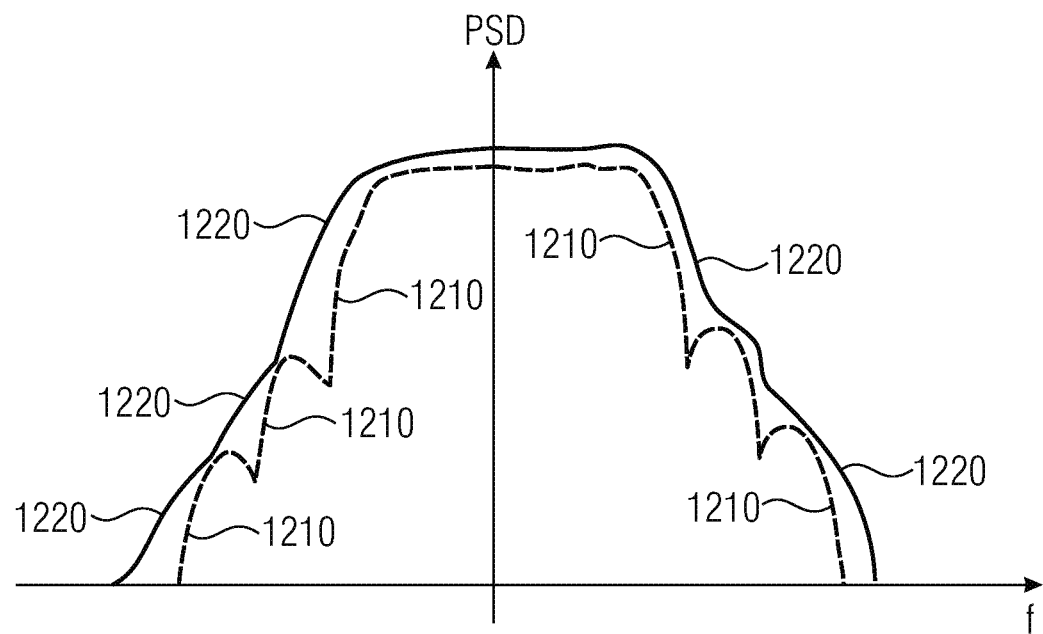
FIG. 12a compares a first actual power density spectrum with a first spectral mask, the first actual power density spectrum corresponding to the first predefined spectral mask.

FIG. 12a compares a first actual power density spectrum 1210 to a first spectral mask 1220, wherein the first actual power density spectrum 1210 corresponds to the first predefined spectral mask 1220: the first actual power density spectrum 1210 will remain below the first predefined spectral mask 1220, which indicates here, for example, that the first actual power density spectrum 1210 corresponds to the first spectral mask 1220. This means that probably there is no fault.

Figure 12B:
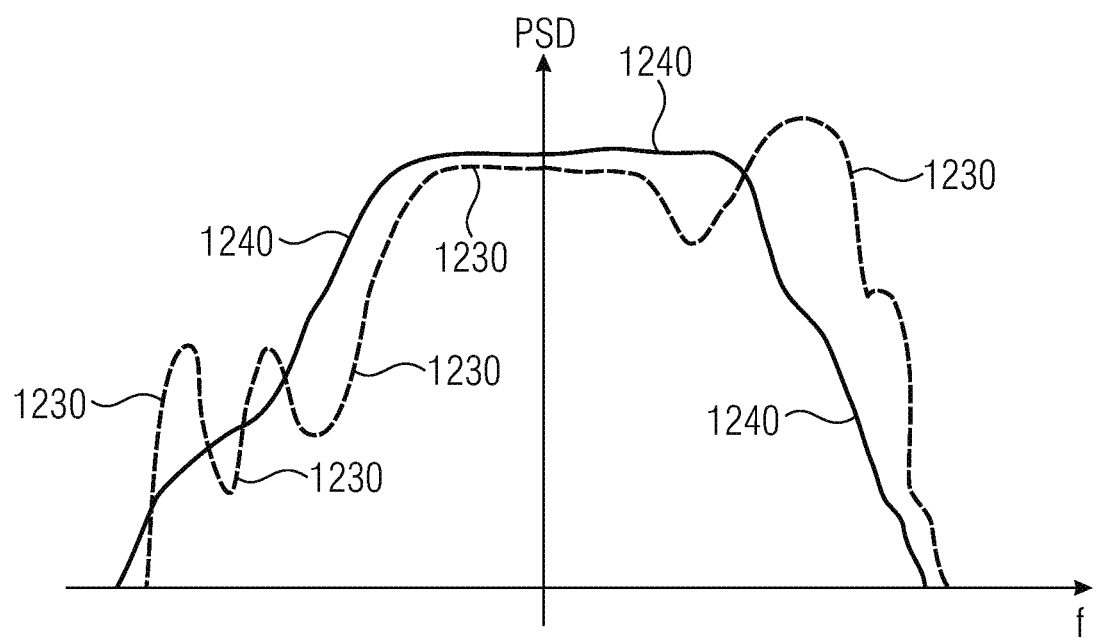
FIG. 12b compares a second actual power density spectrum with a second spectral mask, the second actual power density spectrum not corresponding to the second predefined spectral mask.

FIG. 12b compares a second actual power density spectrum 1230 to a second spectral mask 1240, wherein the second actual power density spectrum 1230 does not correspond to the second predefined spectral mask 1240: The second actual power density spectrum 1230 is partly larger than the second predefined spectral mask 1240, which indicates, for example, that the second actual power density spectrum 1230 does not correspond to the second spectral mask 1240. This means that probably there is a fault.

FIG. 6 shows a synchronization module 471 for matching the data of the spectrogram analysis with the demodulated radio packets in accordance with a first group of embodiments. In FIG. 6, the spectrogram analyzer 430, the demodulators 241, . . . , 24N and the pre-processing modules 461, . . . , 46N are upstream of the synchronization module 471; the pre-processing modules 461, . . . , 46N are optional.

The synchronization module 471 of FIG. 6 is configured for matching the result data of the spectrogram analysis with the metadata of the demodulated radio packets.

In FIG. 6, one or several virtual spectrogram calculating units 661, . . . , 66N are configured to calculate a virtual spectrogram of the respective radio signals from the information of the demodulated radio packets per demodulator 241, . . . , 24N. Making reference to the bottom of FIG. 8, a potential method for generating the virtual spectrogram is presented.

A quantized spectrogram calculating unit 630 is configured to form a spectral image for each radio packet recognized from the results of the spectrogram analysis, in the same way as when generating the virtual spectrograms by the virtual spectrogram calculating units 661, . . . 66N. Thus, the quantized spectrogram calculating unit 630 is configured to calculate a quantized image of the spectrogram from a superpositioning of the spectral images of the radio signals.

A spectral image of a radio packet may, for example, be understood to be a spectrogram of the radio packet in the time-frequency domain.

A comparison unit 670 is configured to compare a quantized spectrogram each portion after portion to the virtual spectrogram of a demodulator 241, . . . , 24N and perform matching on a radio packet level. Different concepts may be used here in different embodiments.

Exemplarily, the spectrograms may be subdivided into spectral regions. Subsequently, the equivalent regions of each virtual spectrogram may be compared to those of the quantized spectrogram by means of correlation of temporally variable portions. In the end, the demodulated radio packets are associated to their counterparts in the spectral images of the radio signals (the results of spectrogram analysis) and transferred to a common data set.

In addition, the offset between the receive times of the radio signals detected in the spectrogram analysis and the demodulated radio packets can be established. In case separate hardware components are used for the spectral analysis and demodulation of the radio packets, the temporal offset between the spectral analysis and the demodulators can be concluded from the statistical analysis of the time differences mentioned before (the offset between the receive times).

In embodiments, the synchronization module 471 may be configured to calculate a quantized spectrogram based on the one or several characteristics of a radio packet found in the spectrogram of the two or several radio packets found. Thus, the synchronization module 471 may be configured to calculate a virtual spectrogram based on the additional information for one of the two or several demodulated radio packets. Additionally, the synchronization module 471 may be configured to compare the quantized spectrogram and the virtual spectrogram to each other in order to determine whether this radio packet found in the spectrogram corresponds to this demodulated radio packet.

Subsequently, matching the data of the spectrogram analysis with the demodulated radio packets in accordance with a second group of embodiments will be described referring to FIG. 7.

FIG. 7 shows a synchronization module 472 for matching the data of the spectrogram analysis with the demodulated radio packets in accordance with a second group of embodiments. In FIG. 7, the spectrogram analyzer 430, the demodulators 241, . . . , 24N and the pre-processing modules 461, . . . , 46N are upstream of the synchronization module 472; the pre-processing modules 461, . . . , 46N are optional.

As regards their basic structure, the embodiments of FIG. 7 are similar to the embodiments having been described referring to FIG. 6. One of the differences of the embodiments of FIG. 7 when compared to FIG. 6 is that only the features of the spectral images of the radio signals or radio packets are used for comparing the data of the spectrogram analysis and the data of the demodulated radio packets, instead of generating a quantized spectrogram and virtual spectrograms. Thus, a considerable simplification of the calculating complexity is the result for FIG. 7. In the embodiments of FIG. 7, spectral feature establishing units 761, . . . , 76N may be provided for calculating the spectral features of the radio packets.

The spectral features, generated by the spectrogram analysis, of the radio signals detected are fed directly to the comparison unit 770. The features of the respective spectral image are calculated from the data of each demodulated radio packet and also fed to the comparison module. The calculation of the features of the respective spectral image is performed in the same way as is described below referring to FIG. 8.

The comparison unit 770 separates the radio signals and radio packets obtained while considering their succession, as regards carrier frequency and bandwidth. Exemplarily, the comparison unit 770 examines in each group (that is combination of carrier frequency and bandwidth) the succession of the radio signals or radio packets, for example for similarities as regards packet duration, receive power, succession. Methods like the Lewenstein distance, Fuzzy Hashing or Piecewise Hashing may, for example, be used for this. In the end, the comparison block establishes similarities between the radio signals and the radio packets and associates these in the same way as is described for the embodiments of FIG. 6.

In embodiments, the synchronization module 472 may also be configured to compare at least one characteristic of the one or several characteristics of a radio packet found in the spectrogram of the two or several radio packets found to information from the additional information of a demodulated radio packet of the two or several demodulated radio packets in order to determine whether this radio packet found in the spectrogram corresponds to this demodulated radio packet.

Calculating a virtual spectrogram in accordance with embodiments will be described below referring to FIG. 8.

FIG. 8 shows a block circuit diagram for calculating the virtual spectrogram of the demodulated radio packet in accordance with an embodiment. The virtual spectrogram calculating units 661, . . . , 66N of FIG. 6 may be configured to implement the calculation of the virtual spectrogram in accordance with FIG. 8.

In accordance with FIG. 8, in a first step, different features of a spectral image may be calculated for each demodulated radio packet from its contents, additional information of the bit transmission layer and the configuration data of the demodulator (one of the demodulators 241, . . . , 24N).

The bandwidth and the spectral mask of the spectral image are calculated from the radio protocol and the modulation and encoding methods used of the radio packet. Here, polling a corresponding database may also be employed. Thus, missing features of the spectral image of the radio packet (like packet duration, bandwidth) can be calculated and added to the dataset of the demodulated radio packet.

Subsequently, a spectral image is generated from the spectral features (like receive time, packet duration, receive power, center frequency, bandwidth, spectral mask) of each radio packet. A virtual spectrogram is calculated by aggregating the spectral images of the radio signals of the respective demodulator.

Embodiments of the invention realize a combination of information of the demodulated radio packets with information from the spectrogram analysis. Due to the combination of the information from two domains (spectral range and radio packet contents), the database is improved and extended for subsequent analyses, like analyzing the state of the radio connections or cause diagnosis in the case of faults occurring. This results in a significantly higher estimation quality and estimation precision of subsequent analyses. In cause diagnosis, for example, this results in a reduction in first and second type errors.

Furthermore, embodiments allow detecting temporal, spatial and spectral overlapping between neighboring radio systems or radio connections. By associating the results of the spectrogram analysis with the data of the demodulated radio packets, packet collisions can be recognized and the respective radio packets involved be associated. This offers specific hints as to the potential cause and effect relation between the radio connections involved for subsequent analyses. This supports state analyses and cause diagnosis, improves the estimation quality, for example. In some scenarios, cause diagnosis only becomes possible by associating the results from spectral analysis to the information of the demodulated radio packets.

Additionally, embodiments realize an automatic analysis of the radio-frequency spectrum. Due to the automatic spectrogram analysis, all the radio signals are for the first time detected spectrally and analyzed. Due to the high detection probability and sensitivity of the spectrogram analysis, newly occurring active radio systems or radio nodes are recognized early and very quickly. Packet collisions between spatially neighboring radio connections are also recognized automatically. On the basis of the radio signals detected, different statistical evaluations can be performed globally and also specifically for selected radio protocols. Exemplarily, statistical analyses may be performed in relation to the following parameters: utilization of the respective radio-frequency band, receive power of the radio signals, frequency of occurrence of radio signals, duration of radio signals.

Although some aspects have been described in the context of an apparatus, it is clear that these aspects also represent a description of the corresponding method, such that a block or element of an apparatus also corresponds to a respective method step or a feature of a method step. Analogously, aspects described in the context of a method step also represent a description of a corresponding block or item or feature of a corresponding apparatus. Some or all of the method steps may be executed by (or using) a hardware apparatus, like, for example, a microprocessor, a programmable computer or an electronic circuit. In some embodiments, some or several of the most important method steps may be executed by such an apparatus.

Depending on certain implementation requirements, embodiments of the invention can be implemented in hardware or in software or at least partly in hardware or at least party in software. The implementation can be performed using a digital storage medium, for example a floppy disk, a DVD, a Blu-Ray disc, a CD, ROM, PROM, EPROM, EEPROM or FLASH memory, a hard drive or another magnetic or optical memory having electronically readable control signals stored thereon, which cooperate or are capable of cooperating with a programmable computer system such that the respective method will be performed. Therefore, the digital storage medium may be computer-readable.

Some embodiments according to the invention include a data carrier comprising electronically readable control signals, which are capable of cooperating with a programmable computer system, such that one of the methods described herein will be performed.

Generally, embodiments of the present invention can be implemented as a computer program product comprising program code, the program code being operative for performing one of the methods when the computer program product runs on a computer.

The program code may, for example, be stored on a machine-readable carrier.

Other embodiments comprise the computer program for performing one of the methods described herein, wherein the computer program is stored on a machine-readable carrier. In other words, an embodiment of the inventive method is, therefore, a computer program comprising program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein. The data carrier or the digital storage medium or the computer-readable medium are typically tangible and/or non-volatile.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises processing means, for example a computer, or a programmable logic device, configured to or adapted to perform one of the methods described herein.

A further embodiment comprises a computer having installed thereon the computer program for performing one of the methods described herein.

A further embodiment according to the invention comprises a device or a system configured to transfer a computer program for performing at least one of the methods described herein to a receiver. The transmission can be performed electronically or optically. The receiver may, for example, be a computer, a mobile device, a memory device or the like. The device or system may, for example, comprise a file server for transferring the computer program to the receiver.

In some embodiments, a programmable logic device (for example a field-programmable gate array, FPGA) may be used to perform some or all of the functionalities of the methods described herein. In some embodiments, a field-programmable gate array may cooperate with a microprocessor in order to perform one of the methods described herein. Generally, the methods may be performed by any hardware apparatus. This may be universally applicable hardware, such as a computer processor (CPU), or hardware specific for the method, such as ASIC.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LITERATURE

[1] Wetzker, Ulf et. al.: "Troubleshooting Wireless Coexistence Problems in the Industrial Internet of Things", IEEE Intl. Conference on Embedded and Ubiquitous Computing (EUC), August 2016.

[2] Frotzscher, Andreas: "Ist Funk in der Industrie zukunftssicher?", SPS IPC Drives Messe, Nuremberg, November 2016.

[3] RSA7100A: available at: https://www.tek.com/datasheet/rsa7100a.

[4] AirMagnet WiFi Analyzer PRO: available at: http://enterprise-de.netscout.com/enterprise-network/wireless-network/AirMagnet-WiFi-Analyzer.

[5] AirMagnet Spectrum XT: available at: http://enterprise-de.netscout.com/content/datasheet-airmagnet-spectrum-xt

[6] U.S. Pat. No. 7,184,777 B2.
[7] EP 3 170 333 A1.
[8] US 2003 0198200 A1.
[9] US 2009 0052500 A1.
[10] US 2007 0264939 A1.

The invention claimed is:

1. An apparatus for analyzing one or more radio systems, comprising:
   one or more radio-frequency units for generating one or more baseband signals from one or more radio signals,
   a spectral analysis module for performing spectral analysis, wherein one of the one or more baseband signals is transformed to a time-frequency domain in order to acquire a spectrogram in the time-frequency domain,
   one or more demodulators for generating two or more demodulated radio packets of the one or more radio systems from the one or more baseband signals, said one or more demodulators being configured to provide additional information for each of the two or several demodulated radio packets,
   a spectrogram analyzer for detecting two or several radio packets found in the spectrogram in the time-frequency domain and for establishing one or more characteristics for each of the two or several radio packets found based on the spectrogram in the time-frequency domain, and
   a synchronization module configured to determine one or more pairs, wherein each of the one or more pairs comprises precisely one demodulated radio packet of the two or more demodulated radio packets and comprising the one or more characteristics of precisely one found radio packet of the two or several radio packets found,
   wherein the synchronization module is configured to determine each of the one or more pairs such that the one or more characteristics of the found radio packet in the spectrogram of the two or several radio packets found is/are associated to the demodulated radio packet of the pair in the pair which corresponds to the demodulated radio packet of the pair,
   wherein the synchronization module is configured to determine each of the one or more pairs in dependence on the additional information of the two or several demodulated radio packets and in dependence on the characteristics of the two or several radio packets found, and
   wherein the synchronization module is configured to output the one or more pairs or information depending on the one or more pairs.

2. The apparatus in accordance with claim 1,
   wherein the spectrogram analyzer comprises a packet detector for detecting the two or several radio packets found in the spectrogram in the time-frequency domain, and
   wherein the spectrogram analyzer comprises an allocation unit for allocating one or more characteristics to each of the two or several radio packets found based on the spectrogram in the time-frequency domain, wherein the one or more characteristics of the two or several radio packets found is/are at least a receive time of one of the two or several radio packets found or a carrier frequency or a bandwidth or a receive power or a duration of the one of the two or several radio packets found or a power spectrum of the one of the two or several radio packets found.

3. The apparatus in accordance with claim 2,
wherein the spectrogram analyzer comprises a noise power detector is configured to estimate a noise power in the spectrogram,
wherein the packet detector is configured to determine power values or power density values in the spectrogram which are smaller than or equaling a threshold value which depends on the noise power, in the spectrogram to be regions in the time-frequency domain where there is no radio packet, and
wherein the packet detector is configured to determine regions in the time-frequency domain which comprise power values or power density values greater than the threshold value, to be regions in the time-frequency domain where there is a radio packet.

4. The apparatus in accordance with claim 3,
wherein the noise power detector is configured to estimate the noise power in the spectrogram,
wherein the noise power detector is configured to set power values or power density values which are smaller than or equaling a threshold value which depends on the noise power, in the spectrogram to zero,
wherein the packet detector is configured to determine power values or power density values in the spectrogram, which equal zero, in the spectrogram to be regions in the time-frequency domain where there is no radio packet, and
wherein the packet detector is configured to determine regions in the time-frequency domain which comprise power values or power density values greater than zero, to be regions in the time-frequency domain where there is a radio packet.

5. The apparatus in accordance with claim 2,
wherein the spectrogram analyzer comprises a packet collision detector, wherein the packet collision detector is configured to establish for each of the two or several radio packets found based on the spectrogram in the time-frequency domain whether a collision has occurred for the found radio packet with another one of the two or several radio packets found,
wherein the allocation unit is configured to allocate to the found radio packet, as one of one or more characteristics, the information indicating that a collision has occurred with another one of the two or several radio packets found,
wherein the synchronization module is configured to determine a pair of the one or more pairs such that the precisely one demodulated radio packet of the pair is the radio packet which corresponds to the found radio packet in the spectrogram where there has been a collision with another radio packet, and that one of the one or more characteristics of the pair is the information indicating that there has been a collision in the demodulated radio packet of the pair,
wherein the synchronization module is configured to output the information indicating that there has been a collision in the demodulated radio packet of the pair.

6. The apparatus in accordance with claim 5,
wherein the packet collision detector is configured to establish for two radio packets of the two or several radio packets found whether said radio packets collide with each other, wherein the packet collision detector establishes in the time-frequency domain of the spectrogram whether the two radio packets are free from superpositioning or not.

7. The apparatus in accordance with claim 5,
wherein the synchronization module is configured to output information on a radio protocol of another radio packet which the found radio packet, which corresponds to the demodulated radio packet of the pair, has collided with.

8. The apparatus in accordance with claim 2,
wherein the spectrogram analyzer comprises a feature extractor,
wherein the feature extractor is configured to establish for each of the two or several radio packets found based on the spectrogram in the time-frequency domain whether the found radio packet comprises a fault in the spectrogram,
wherein the allocation unit is configured to allocate to the found radio packet, as one of the one or more characteristics, the information indicating that the found radio packet comprises a fault in the spectrogram,
wherein the synchronization module is configured to determine a pair of the one or more pairs such that the precisely one demodulated radio packet of the pair is the radio packet which corresponds to the found radio packet in the spectrogram comprising a fault in the spectrogram, and that one of the one or more characteristics of the pair is the information indicating that the demodulated radio packet of the pair has been transmitted with a fault occurring,
wherein the synchronization module is configured to output the information indicating that the demodulated radio packet of the pair has been transmitted with a fault occurring.

9. The apparatus in accordance with claim 8,
wherein the feature extractor is configured to establish for a radio packet of the two or several radio packets found based on the spectrogram in the time-frequency domain whether the found radio packet comprises a fault in the spectrogram, wherein the feature extractor establishes whether a power density spectrum of the radio packet comprises an asymmetry in a frequency-power density domain of the spectrogram.

10. The apparatus in accordance with claim 8,
wherein the feature extractor is configured to establish for a radio packet of the two or several radio packets found based on the spectrogram in the time-frequency domain whether the found radio packet comprises a fault in the spectrogram, wherein the feature extractor compares an actual power density spectrum of the radio packet in a frequency-power density domain to a predefined spectral mask.

11. The apparatus in accordance with claim 10,
wherein the feature extractor is configured to load the predefined spectral mask from a database in dependence on a radio protocol of the found radio packet.

12. The apparatus in accordance with claim 1,
wherein the synchronization module is configured to compare:
at least one characteristic of the one or more characteristics of a found radio packet in the spectrogram of the two or several radio packets found
to information from the additional information of a demodulated radio packet of the two or several demodulated radio packets
in order to establish whether the found radio packet in the spectrogram corresponds to the demodulated radio packet.

13. The apparatus in accordance with claim 1,
wherein the synchronization module is configured to calculate a quantized spectrogram based on one or more characteristics of a found radio packet in the spectrogram of the two or several radio packets found, wherein the synchronization module is configured to calculate a virtual spectrogram based on the additional information for one of the two or several demodulated radio packets, and wherein the synchronization module is configured to compare the quantized spectrogram and the virtual spectrogram to each other in order to establish whether the found radio packet in the spectrogram corresponds to the demodulated radio packet.

14. The apparatus in accordance with claim 1, wherein the apparatus additionally comprises one or more antennas for detecting the one or more radio signals.

15. A method for analyzing one or more radio systems, comprising:

generating one or more baseband signals from one or more radio signals, performing spectral analysis, wherein one of the one or more baseband signals is transformed to a time-frequency domain in order to acquire a spectrogram in the time-frequency domain, generating two or more demodulated radio packets of the one or more radio systems from the one or more baseband signals and providing additional information for each of the two or more demodulated radio packets, detecting two or several radio packets found in the spectrogram in the time-frequency domain and establishing one or more characteristics for each of the two or several radio packets found based on the spectrogram in the time-frequency domain, and determining one or more pairs, wherein each of the one or more pairs comprises precisely one demodulated radio packet of the two or more demodulated radio packets and comprising the one or more characteristics of precisely one found radio packet found of the two or several radio packets found, wherein each of the one or more pairs is determined such that the one or more characteristics of the found radio packet in the spectrogram of the two or several radio packets found is/are associated with the demodulated radio packet of the pair in the pair corresponding to the demodulated radio packet of the pair, wherein each of the one or more pairs is determined in dependence on the additional information of the two or several demodulated radio packets and in dependence on the characteristics of the two or several radio packets found, and outputting the one or more pairs or information depending on the one or more pairs.

16. A non-transitory digital storage medium having stored thereon a computer program for performing a method for analyzing one or more radio systems comprising:

generating one or more baseband signals from one or more radio signals, performing spectral analysis, wherein one of the one or more baseband signals is transformed to a time-frequency domain in order to acquire a spectrogram in the time-frequency domain, generating two or more demodulated radio packets of the one or more radio systems from the one or more baseband signals and providing additional information for each of the two or more demodulated radio packets, detecting two or several radio packets found in the spectrogram in the time-frequency domain and establishing one or more characteristics for each of the two or several radio packets found based on the spectrogram in the time-frequency domain, and determining one or more pairs, wherein each of the one or more pairs comprises precisely one demodulated radio packet of the two or more demodulated radio packets and comprising the one or more characteristics of precisely one found radio packet of the two or several radio packets found, wherein each of the one or more pairs is determined such that the one or more characteristics of the found radio packet in the spectrogram of the two or several radio packets found is/are associated with the demodulated radio packet of the pair in the pair corresponding to the demodulated radio packet of the pair, wherein each of the one or more pairs is determined in dependence on the additional information of the two or several demodulated radio packets and in dependence on the characteristics of the two or several radio packets found, and outputting the one or more pairs or information depending on the one or more pairs, when said computer program is run by a computer.

* * * * *

UNITED STATES PATENT AND TRADEMARK OFFICE
CERTIFICATE OF CORRECTION

Page 1 of 1

PATENT NO. : 10,574,435 B2
APPLICATION NO. : 16/220855
DATED : February 25, 2020
INVENTOR(S) : Wetzker et al.

It is certified that error appears in the above-identified patent and that said Letters Patent is hereby corrected as shown below:

In the Claims

Column 23 Claim 15, Line 36 should read as: …. precisely one found radio packet of the two or ….

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*